(12) United States Patent
Le et al.

(10) Patent No.: US 11,100,946 B1
(45) Date of Patent: Aug. 24, 2021

(54) SOT DIFFERENTIAL READER AND METHOD OF MAKING SAME

(71) Applicant: Western Digital Technologies, Inc., San Jose, CA (US)

(72) Inventors: Quang Le, San Jose, CA (US); Xiaoyong Liu, San Jose, CA (US); Zhigang Bai, Fremont, CA (US); Zhanjie Li, Pleasanton, CA (US); Kuok San Ho, Emerald Hills, CA (US); Hisashi Takano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/918,841

(22) Filed: Jul. 1, 2020

(51) Int. Cl.
| | |
|---|---|
| *G11B 5/39* | (2006.01) |
| *G11B 5/37* | (2006.01) |
| *H01L 43/04* | (2006.01) |
| *H01L 43/06* | (2006.01) |
| *H01L 43/14* | (2006.01) |
| *G11B 5/00* | (2006.01) |

(52) U.S. Cl.
CPC ............ *G11B 5/374* (2013.01); *G11B 5/3912* (2013.01); *G11B 5/3932* (2013.01); *H01L 43/04* (2013.01); *H01L 43/06* (2013.01); *H01L 43/14* (2013.01); *G11B 2005/0018* (2013.01)

(58) Field of Classification Search
None
See application file for complete search history.

(56) References Cited

U.S. PATENT DOCUMENTS

| | | | |
|---|---|---|---|
| 5,751,521 | A | 5/1998 | Gill |
| 6,657,823 | B2 | 12/2003 | Kawato |
| 6,667,861 | B2 | 12/2003 | Gill |

(Continued)

FOREIGN PATENT DOCUMENTS

| | | |
|---|---|---|
| JP | 4934582 B2 | 5/2012 |
| JP | 2021057357 A | 4/2021 |

OTHER PUBLICATIONS

Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011.2169946.

(Continued)

*Primary Examiner* — William J Klimowicz
(74) *Attorney, Agent, or Firm* — Patterson & Sheridan, LLP; Steven H. Versteeg

(57) ABSTRACT

The present disclosure generally relates to spin-orbital torque (SOT) differential reader designs. The SOT differential reader is a multi-terminal device that comprises a first shield, a first spin hall effect layer, a first free layer, a gap layer, a second spin hall effect layer, a second free layer, and a second shield. The gap layer is disposed between the first spin hall effect layer and the second spin hall effect layer. Electrical lead connections are located about the first spin hall effect layer, the second spin hall effect layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

21 Claims, 19 Drawing Sheets

(56) References Cited

U.S. PATENT DOCUMENTS

| | | |
|---|---|---|
| 6,680,828 B2 | 1/2004 | Gill |
| 6,906,898 B2 | 6/2005 | Kawato |
| 7,016,160 B2 | 3/2006 | Mao et al. |
| 7,242,556 B2 | 7/2007 | Gill |
| 7,298,595 B2 | 11/2007 | Gill |
| 7,436,632 B2 | 10/2008 | Li et al. |
| 7,643,255 B2 | 1/2010 | Gill et al. |
| 7,697,242 B2 | 4/2010 | Gill |
| 7,881,018 B2 | 2/2011 | Gill et al. |
| 8,125,746 B2 | 2/2012 | Dimitrov et al. |
| 8,174,799 B2 | 5/2012 | Hoshiya et al. |
| 8,223,464 B2 | 7/2012 | Yasui et al. |
| 8,570,689 B2 | 10/2013 | Sato et al. |
| 9,472,216 B1 | 10/2016 | Mauri et al. |
| 9,947,347 B1 | 4/2018 | Van Der Heijden et al. |
| 10,127,933 B2 | 11/2018 | Batra et al. |
| 10,483,457 B1 * | 11/2019 | Lee .................... G11C 11/1673 |
| 2014/0226239 A1 | 8/2014 | Mihajlovic et al. |
| 2015/0287426 A1 | 10/2015 | Mihajlovic et al. |
| 2017/0077392 A1 | 3/2017 | Han et al. |
| 2018/0358543 A1 * | 12/2018 | Le .......................... G11B 5/372 |
| 2019/0037703 A1 | 1/2019 | Wang et al. |
| 2019/0392881 A1 * | 12/2019 | Rakshit .................. H01L 43/08 |
| 2021/0056988 A1 * | 2/2021 | Chen .................... G11B 5/3932 |

OTHER PUBLICATIONS

Kotb et al. "Study of spin transfer torque (STT) and spin orbit torque (SOT) magnetic tunnel junctions (MTJs) at advanced CMOS technology nodes," Electrical and Electronics Engineering: an International Journal, (ELELIJ) vol. 6, No. 1, Feb. 2017, pp. 1-9, 10.14810/elelij.2017.6101.

Yuan et al. "Readback Resolution of Differential Dual CPP Spin Valve Reader," IEEE Transactions on Magnetics, vol. 46, No. 6, Jun. 2010, pp. 1667-1670, 10.1109/TMAG.2010.2045106.

International Search Report and the Written Opinion for International Application No. PCT/US2021/033197 dated Jul. 12, 2021, 9 pages.

\* cited by examiner

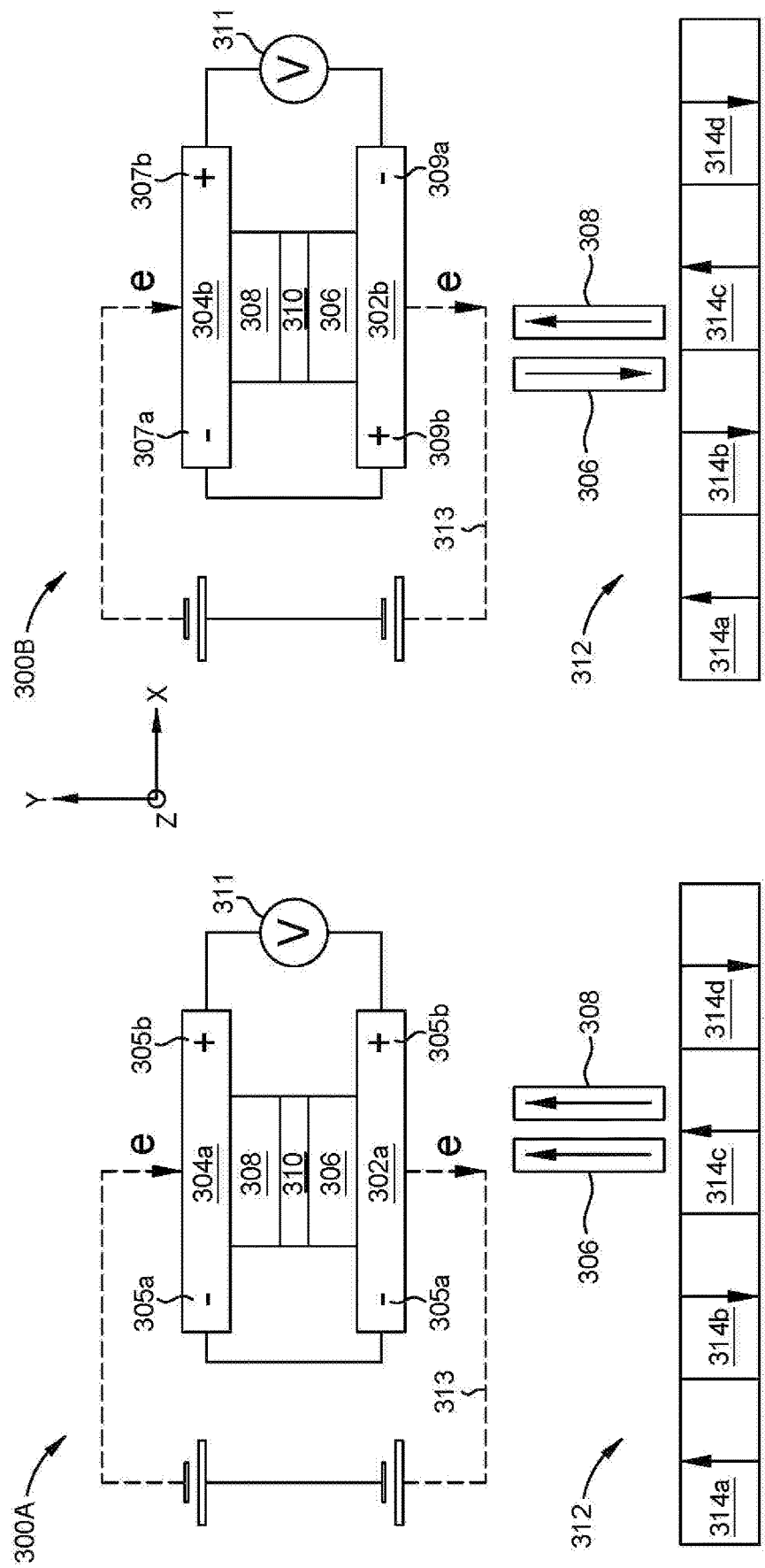

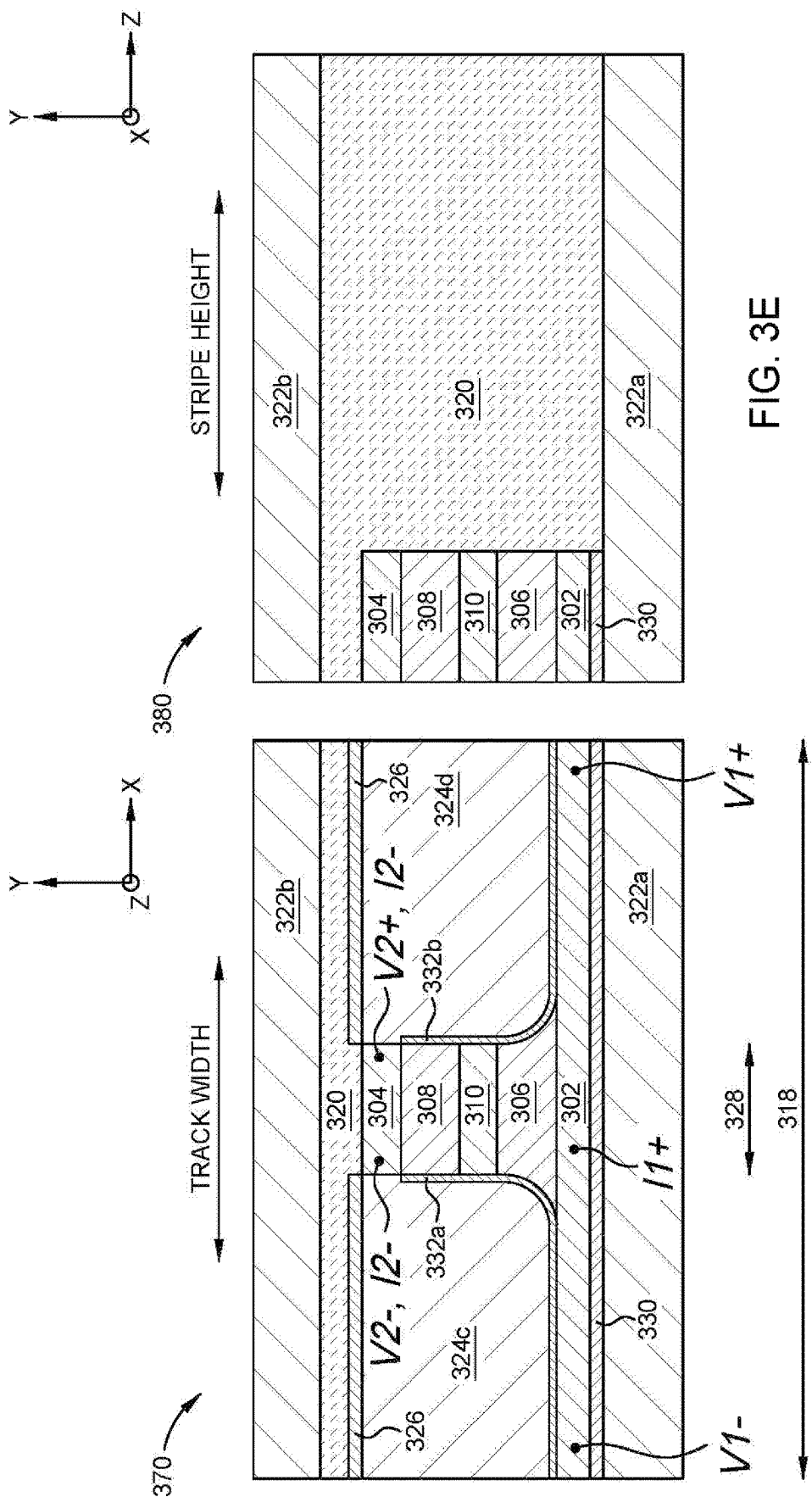

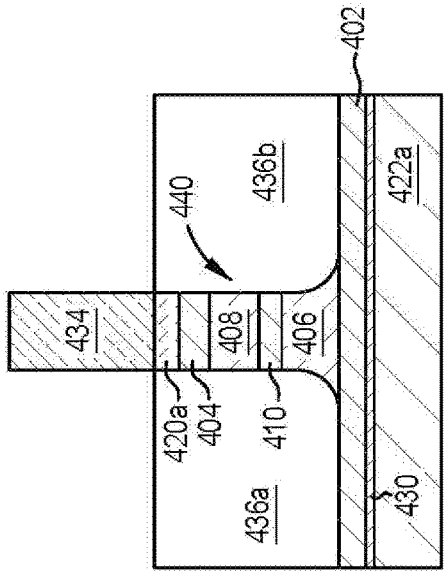
FIG. 4B
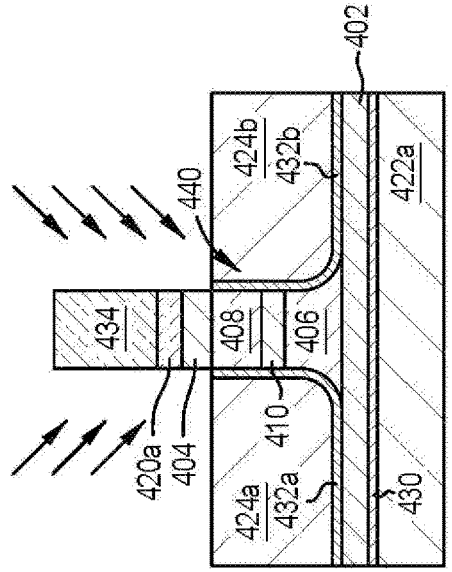
FIG. 4D
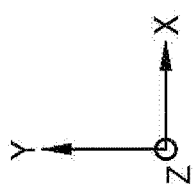
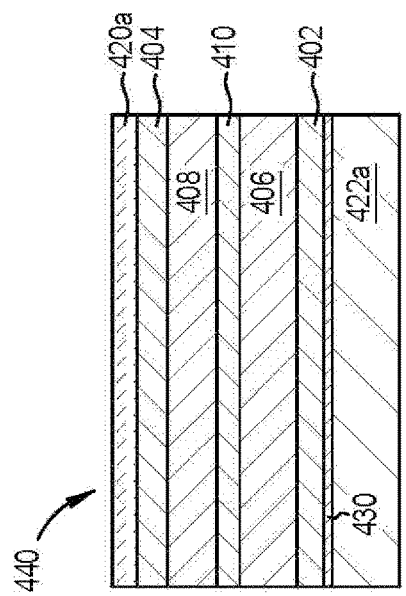
FIG. 4A
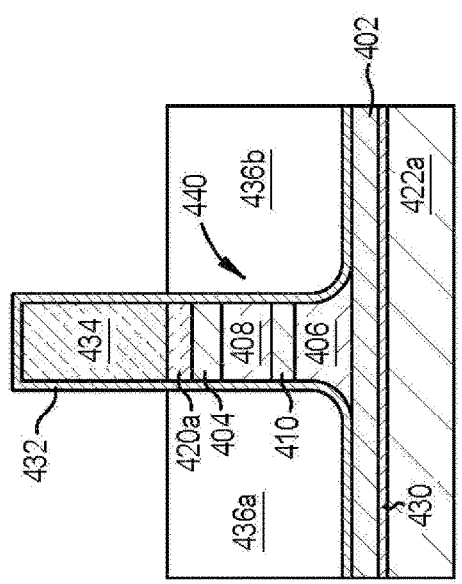
FIG. 4C

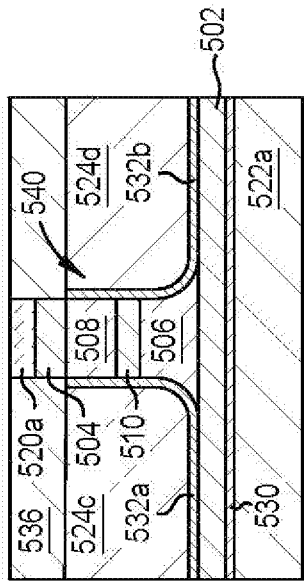
FIG. 5E
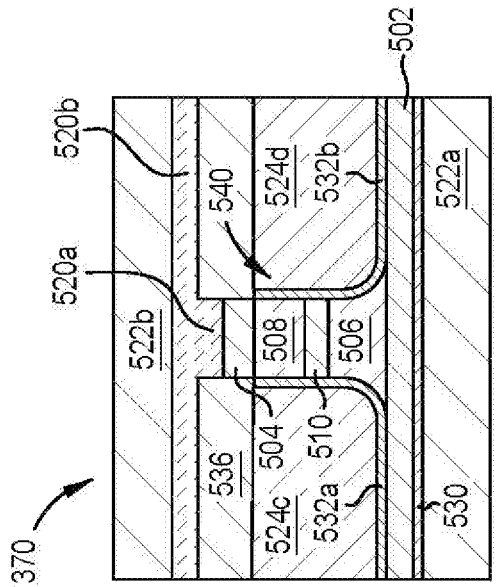
FIG. 5F
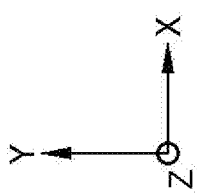
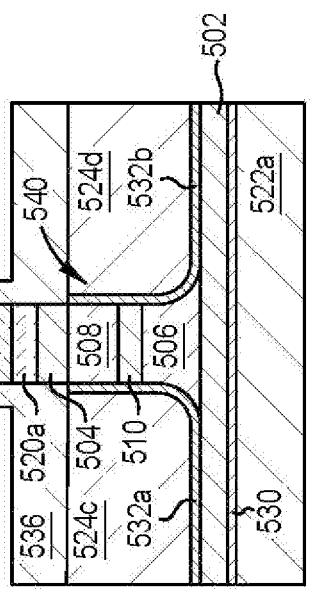
FIG. 5G
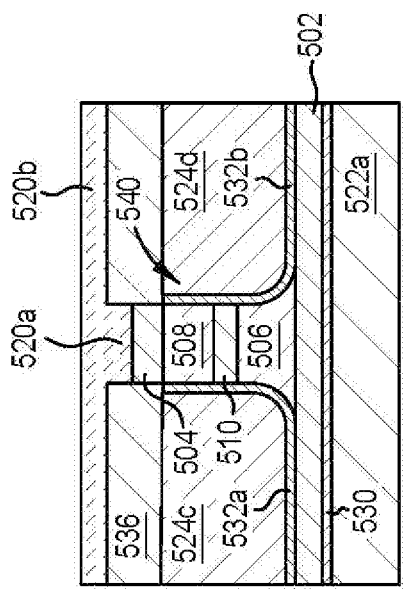
FIG. 5H

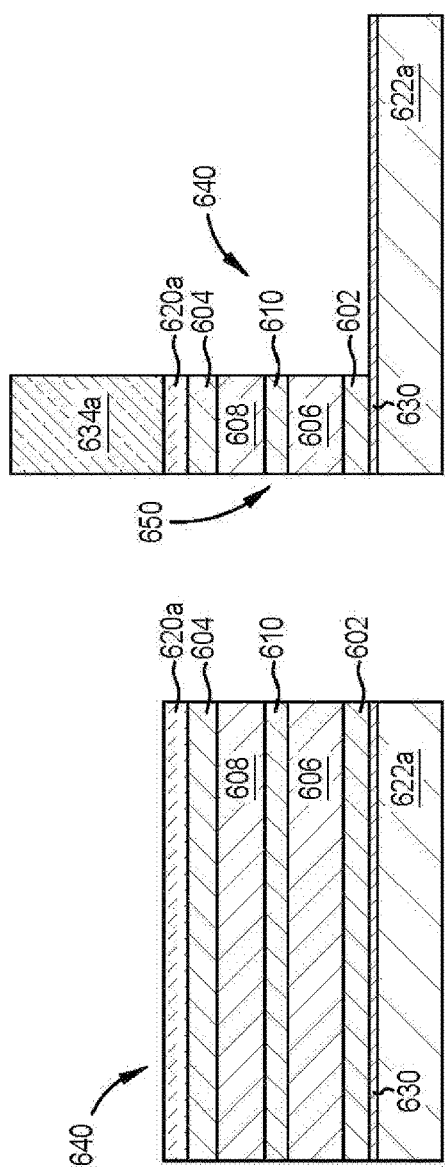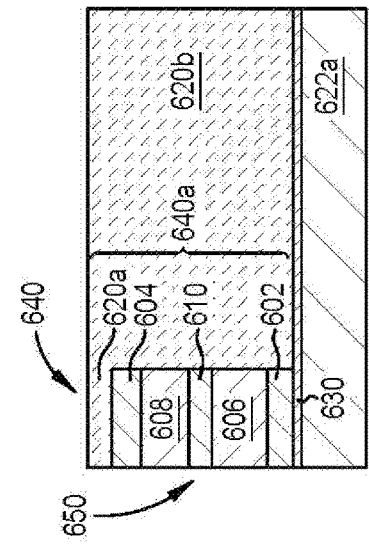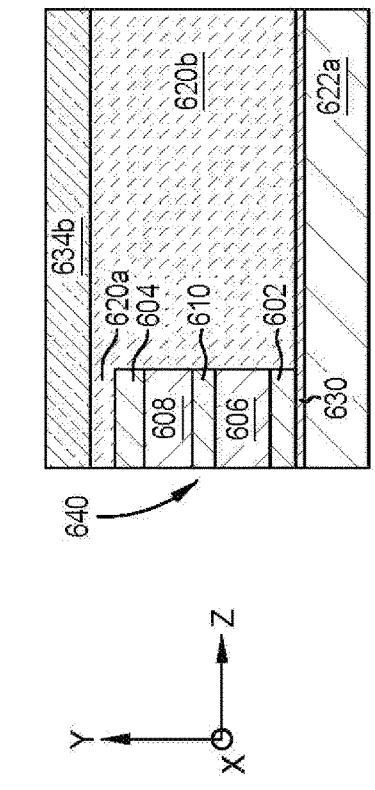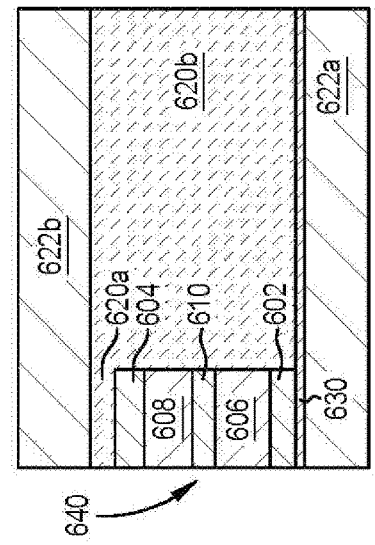
FIG. 6A
FIG. 6B
FIG. 6C
FIG. 6D
FIG. 6E

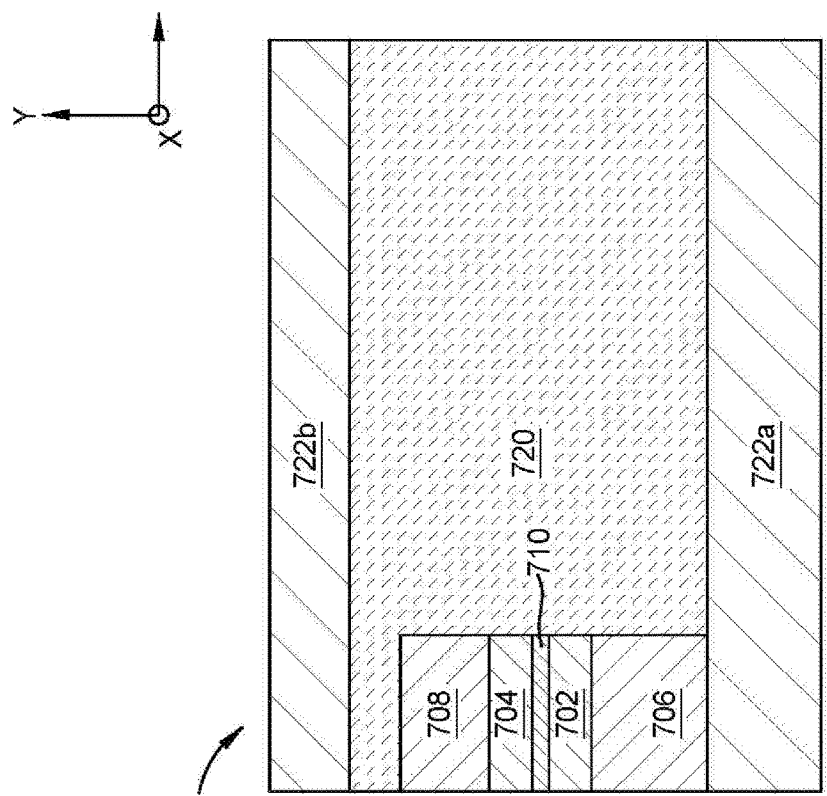
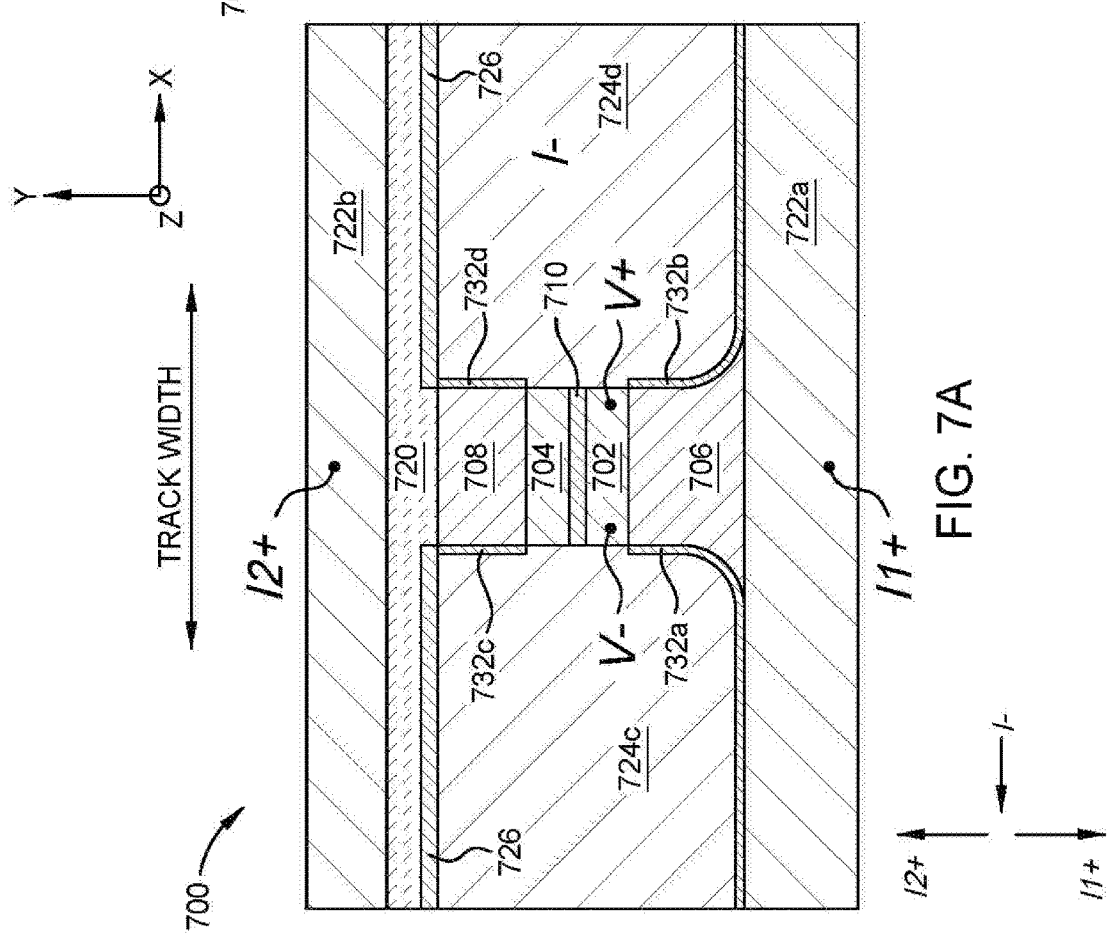
FIG. 7B
FIG. 7A

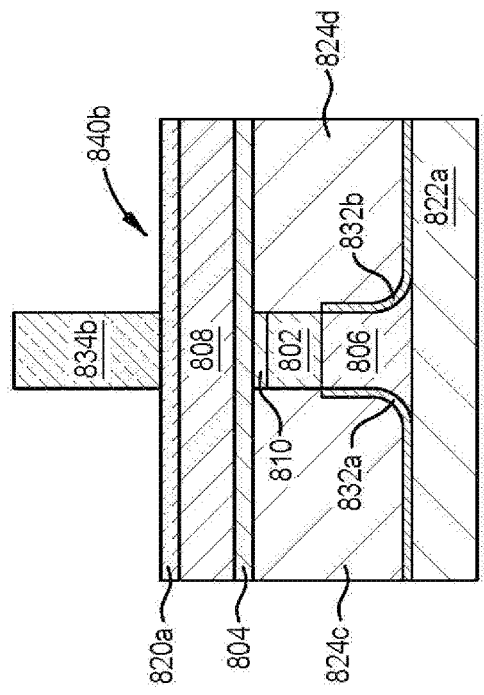
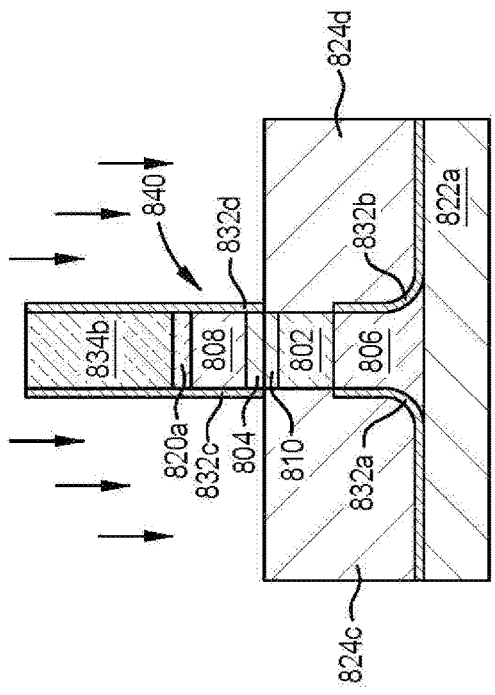
FIG. 8E
FIG. 8F
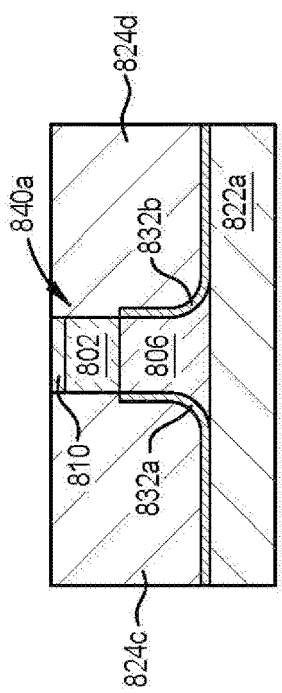
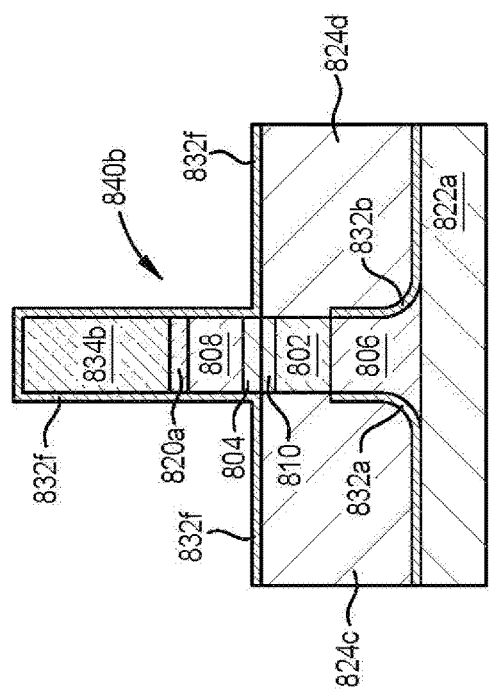
FIG. 8G
FIG. 8H

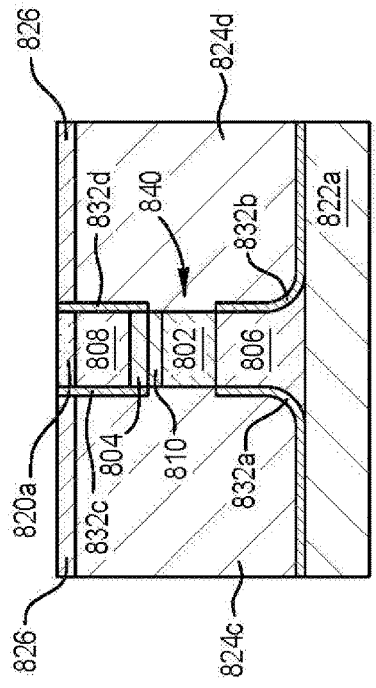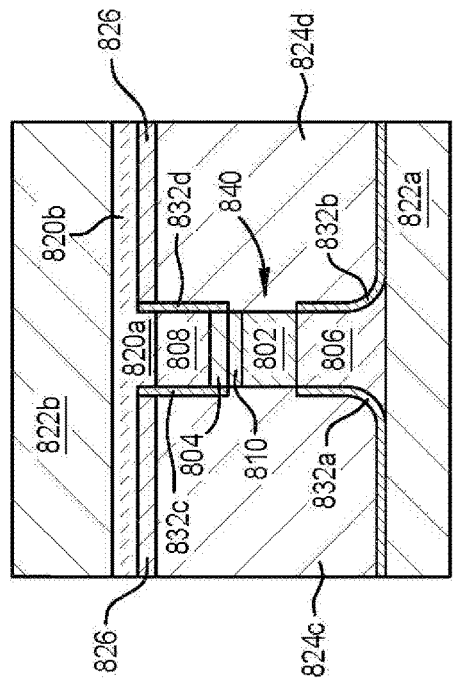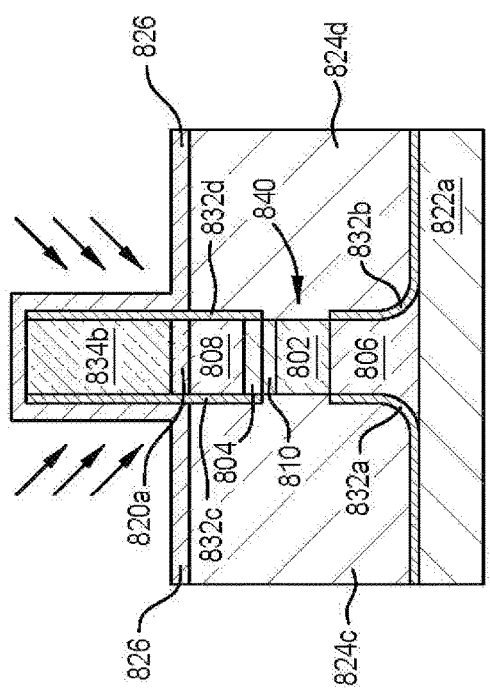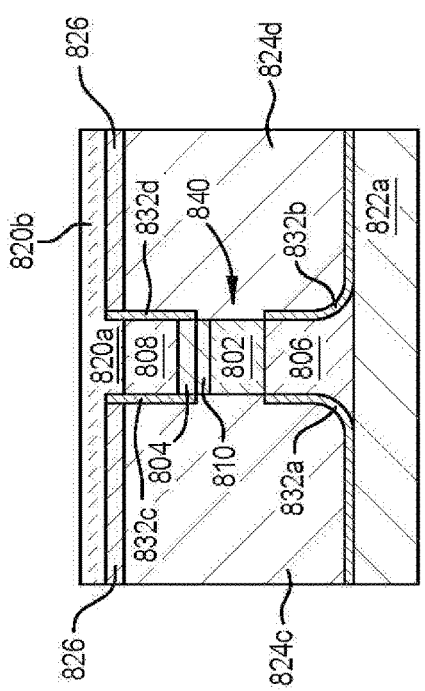

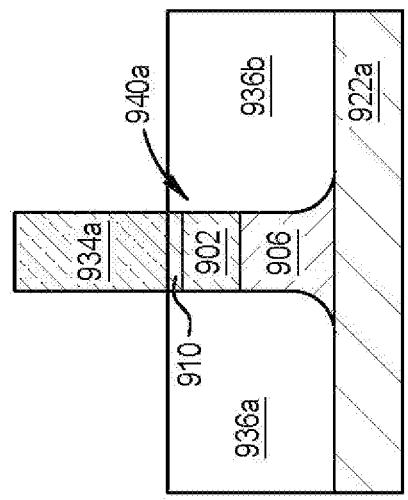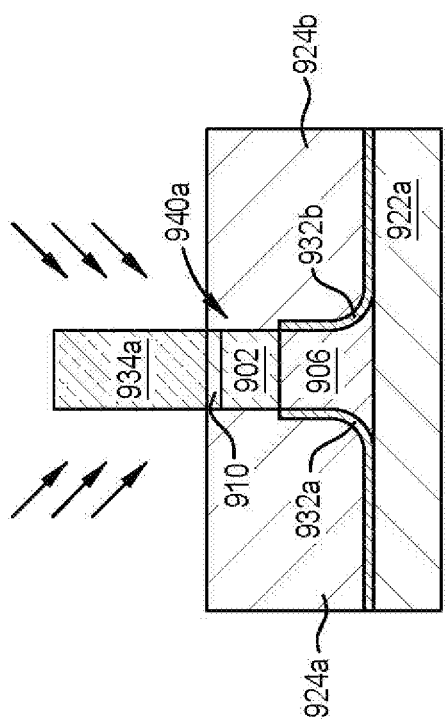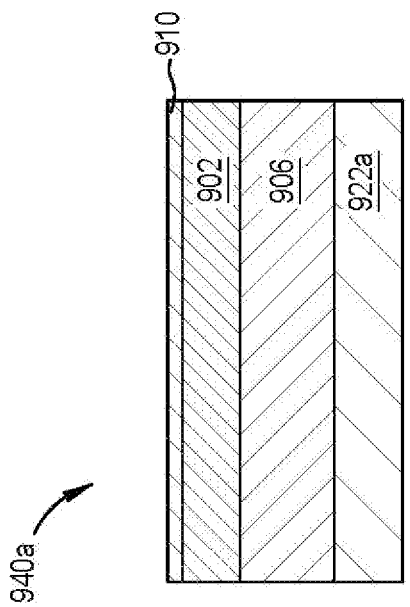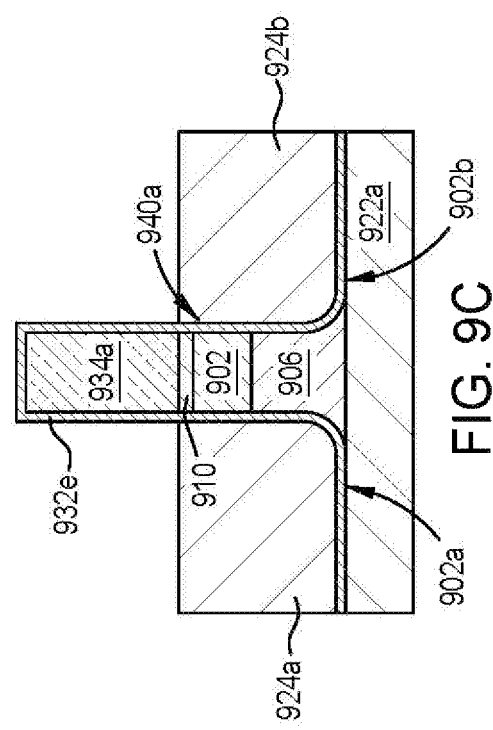

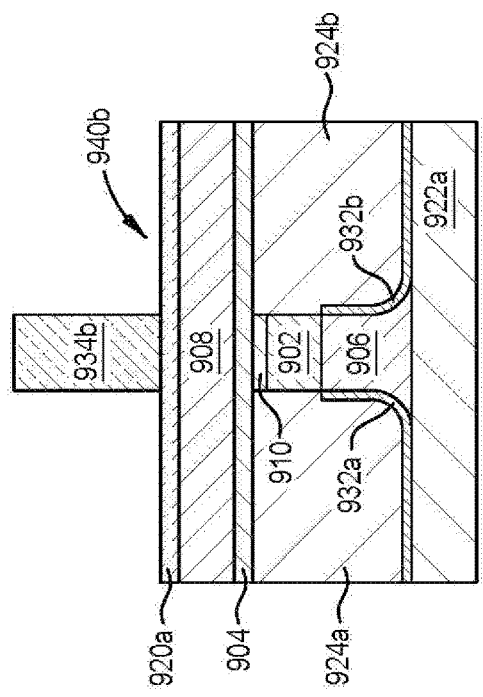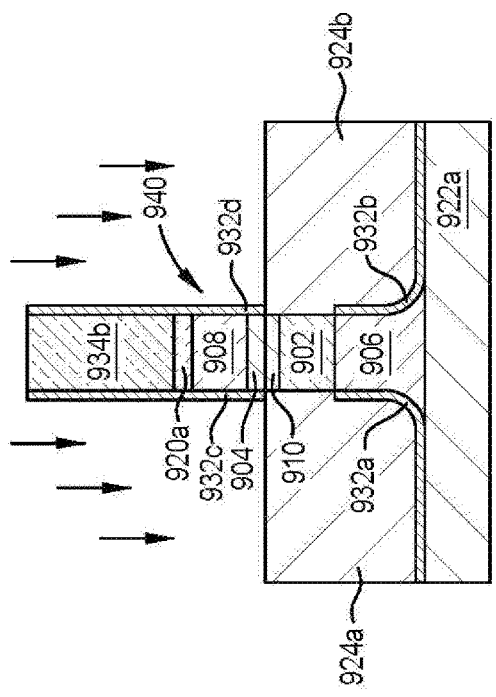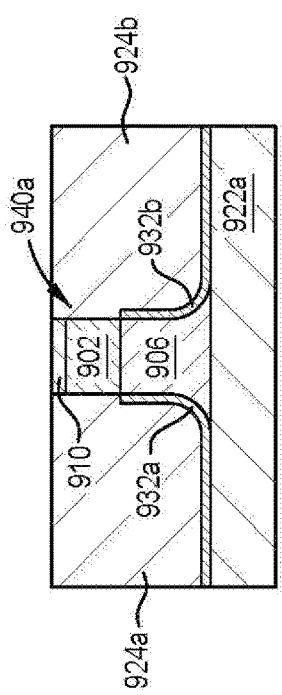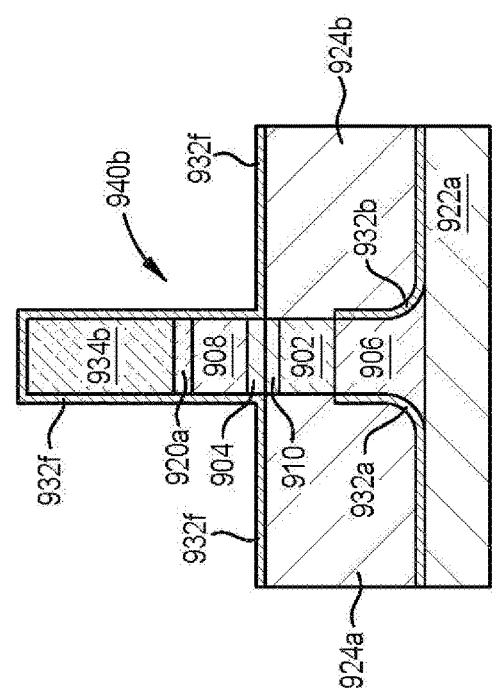

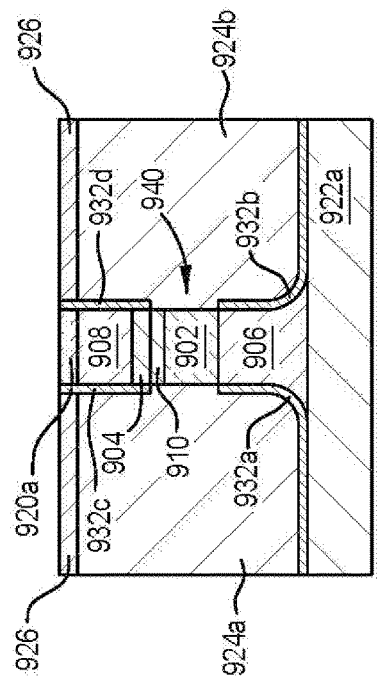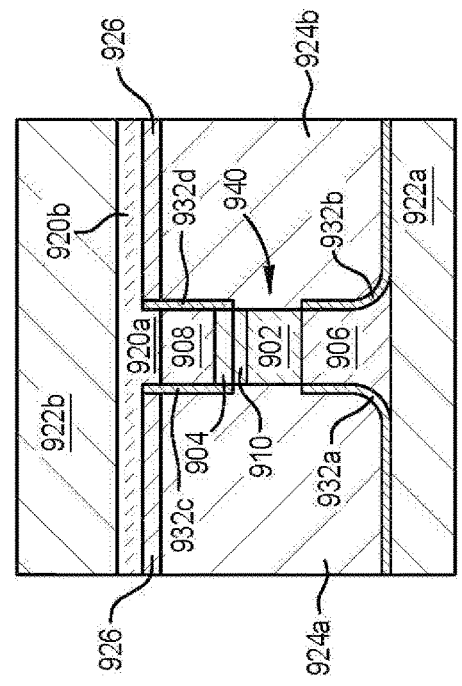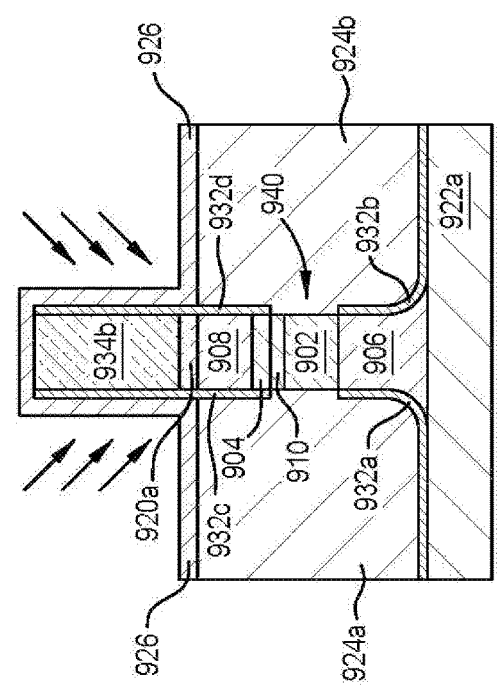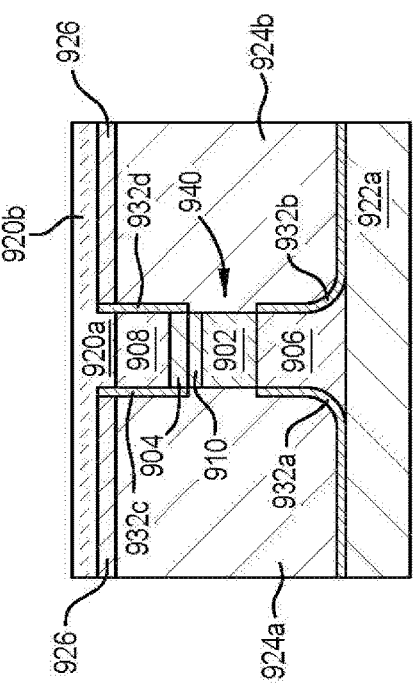

SOT DIFFERENTIAL READER AND METHOD OF MAKING SAME

BACKGROUND OF THE DISCLOSURE

Field of the Disclosure

Embodiments of the present disclosure generally relate to a read head of a data storage device.

Description of the Related Art

The heart of the functioning and capability of a computer is the storing and writing of data to a data storage device, such as a hard disk drive (HDD). The volume of data processed by a computer is increasing rapidly. There is a need for higher recording density of a magnetic recording medium to increase the function and the capability of a computer.

In order to achieve higher recording densities, such as recording densities exceeding 2 $Tbit/in^2$ for a magnetic recording medium, the width and pitch of write tracks are narrowed, and thus the corresponding magnetically recorded bits encoded in each write track are narrowed. Attempts to achieve increasing requirements of advanced narrow gap reader sensors of read heads to achieve reading of higher recording densities have been proposed utilizing magnetoresistive sensors with free layers comprised of high saturation magnetization materials.

Typical read heads include a read sensor sandwiched between two shields. The shield-to-shield spacing of the two shields plays a crucial role in the resolution of the read sensor. However, conventional read sensors are already minimized to about 25 nm, and cannot be reduced in size much further to decrease the shield-to-shield spacing.

Therefore, there is a need in the art for an improved magnetic read head.

SUMMARY OF THE DISCLOSURE

The present disclosure generally relates to spin-orbital torque (SOT) differential reader designs. The SOT differential reader is a multi-terminal device that comprises a first shield, a first spin hall effect layer, a first free layer, a gap layer, a second spin hall effect layer, a second free layer, and a second shield. The gap layer is disposed between the first spin hall effect layer and the second spin hall effect layer. Electrical lead connections are located about the first spin hall effect layer, the second spin hall effect layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

In one embodiment, a magnetic recording head comprises a first shield, a second shield, a first bias layer, a second bias layer, and a spin orbital torque (SOT) differential reader disposed between the first shield and the second shield, and between the first bias layer and the second bias layer. The SOT differential reader comprises a first free layer, a second free layer, a first spin hall effect layer, a second spin hall effect layer, the second spin hall effect layer being in contact with the first bias layer and the second bias layer, and one or more insulation layers, wherein a first insulation layer is disposed between the first spin hall effect layer and the first bias layer, and a second insulation layer is disposed between the first spin hall effect layer and the second bias layer.

In another embodiment, a magnetic recording head comprises a first shield, a second shield, a SOT differential reader disposed at a media facing surface between the first shield and the second shield. The SOT differential reader comprises a first free layer, a second free layer, a gap layer, a first spin hall effect layer, and a second spin hall effect layer, wherein a positive terminal of the first spin hall effect layer is electrically connected to a positive terminal of the second spin hall effect layer, and a signal read out of the SOT differential reader is based on a voltage difference across a negative terminal of the first spin hall effect layer to a negative terminal of the second spin hall effect layer.

In another embodiment, a method of forming a SOT differential reader comprises depositing a first spin hall effect layer over a first shield, a first free layer on the first spin hall effect layer, a gap layer on the first free layer, a second free layer on the gap layer, a second spin hall effect layer on the second free layer, and a first insulation layer on the second spin hall effect layer to form a stack, removing portions of the first spin hall effect layer, the first free layer, the gap layer, the second free layer, the second spin hall effect layer, and the first insulation layer to define a track-width of the stack, depositing a second insulation layer in contact a first surface, a second surface, and a third surface of the stack, wherein a fourth surface of the stack is a media facing surface, removing a portion of the second insulation layer in contact with the second spin hall effect layer, depositing a first bias layer and a second bias layer in contact with the second spin hall effect layer and the first insulation layer on the first and second surfaces of the stack, and depositing a second shield over the stack.

In another embodiment, a method of forming a SOT differential reader comprises depositing a first free layer over a first shield, a first spin hall effect layer on the first free layer, and a gap layer on the first spin hall effect layer to form a first stack, removing portions of the first free layer, the first spin hall effect layer, and the gap layer to define a first track-width of the first stack, depositing a first insulation layer in contact a first surface, a second surface, and a third surface of the first stack, wherein a fourth surface of the first stack is disposed at a media facing surface, removing a portion of the first insulation layer in contact with the first spin hall effect layer and the gap layer, depositing a first bias layer in contact with the first spin hall effect layer, the gap layer, and the first insulation layer, depositing a second spin hall effect layer on the gap layer and a second free layer on the second spin hall effect layer to form a second stack on the first stack, removing portions of the second spin hall effect layer and the second free layer to define a second track-width of the second stack, depositing a second insulation layer in contact a first surface, a second surface, and a third surface of the second stack, wherein a fourth surface of the second stack is disposed at the media facing surface, and depositing a second shield over the second stack.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

FIGS. 3A-3E illustrate a SOT differential reader, according to one embodiment.

FIGS. 4A-4H illustrate a method of forming and defining a track-width of the SOT differential reader of FIG. 3C, according to one embodiment.

FIGS. 5A-5H illustrate a method of forming and defining a track-width of the SOT differential reader of FIG. 3D, according to one embodiment.

FIGS. 6A-6E illustrate a method of forming and defining a stripe height of the SOT differential reader 380 of FIG. 3E, according to one embodiment.

FIGS. 7A-7B illustrate a SOT differential reader, according to one embodiment.

FIGS. 8A-8L illustrate a method of forming and defining a track-width of the SOT differential reader of FIG. 7A, according to one embodiment.

FIGS. 9A-9L illustrate a method of forming and defining a track-width of the SOT differential reader of FIG. 7A, according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to spin-orbital torque (SOT) differential reader designs. The SOT differential reader is a multi-terminal device that comprises a first shield, a first spin hall effect layer, a first free layer, a gap layer, a second spin hall effect layer, a second free layer, and a second shield. The gap layer is disposed between the first spin hall effect layer and the second spin hall effect layer. Electrical lead connections are located about the first spin hall effect layer, the second spin hall effect layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

Figure 1:
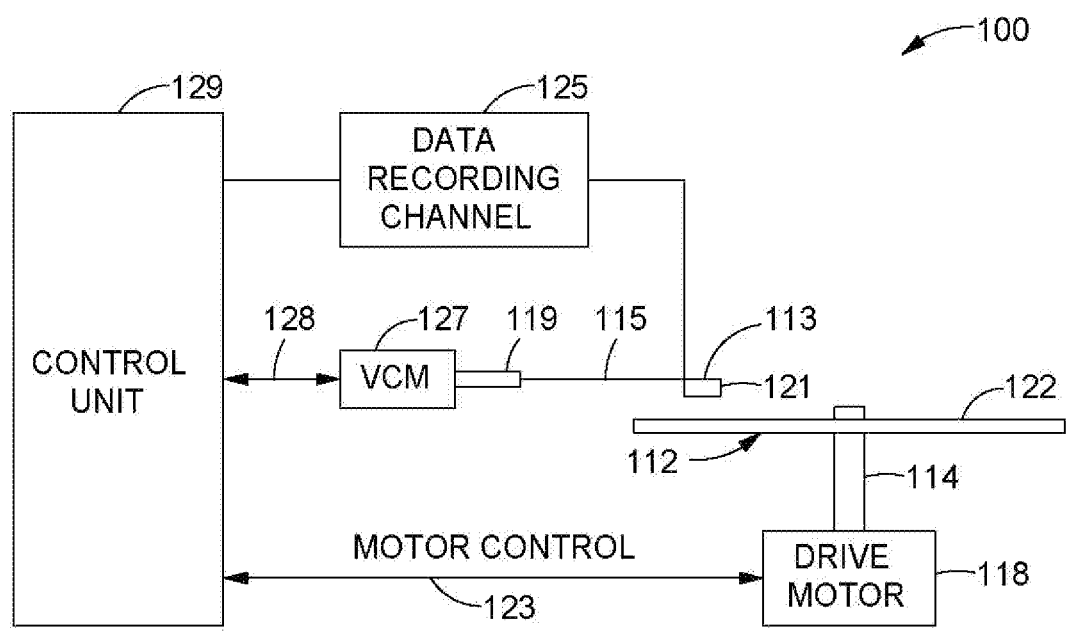
FIG. 1 illustrates a disk drive embodying this disclosure.

FIG. 1 illustrates a disk drive 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the media surface 122 which exerts an upward force or lift on the slider 113. The air bearing thus counterbalances the slight spring force of suspension 115 and supports slider 113 off and slightly above the media 112 surface by a small, substantially constant spacing during normal operation. In the case of EAMR, a DC magnetic field generated from an assist element of the magnetic head assembly 121 enhances the write-ability so that the write element of the magnetic head assembly 121 may efficiently magnetize the data bits in the media 112.

The various components of the disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
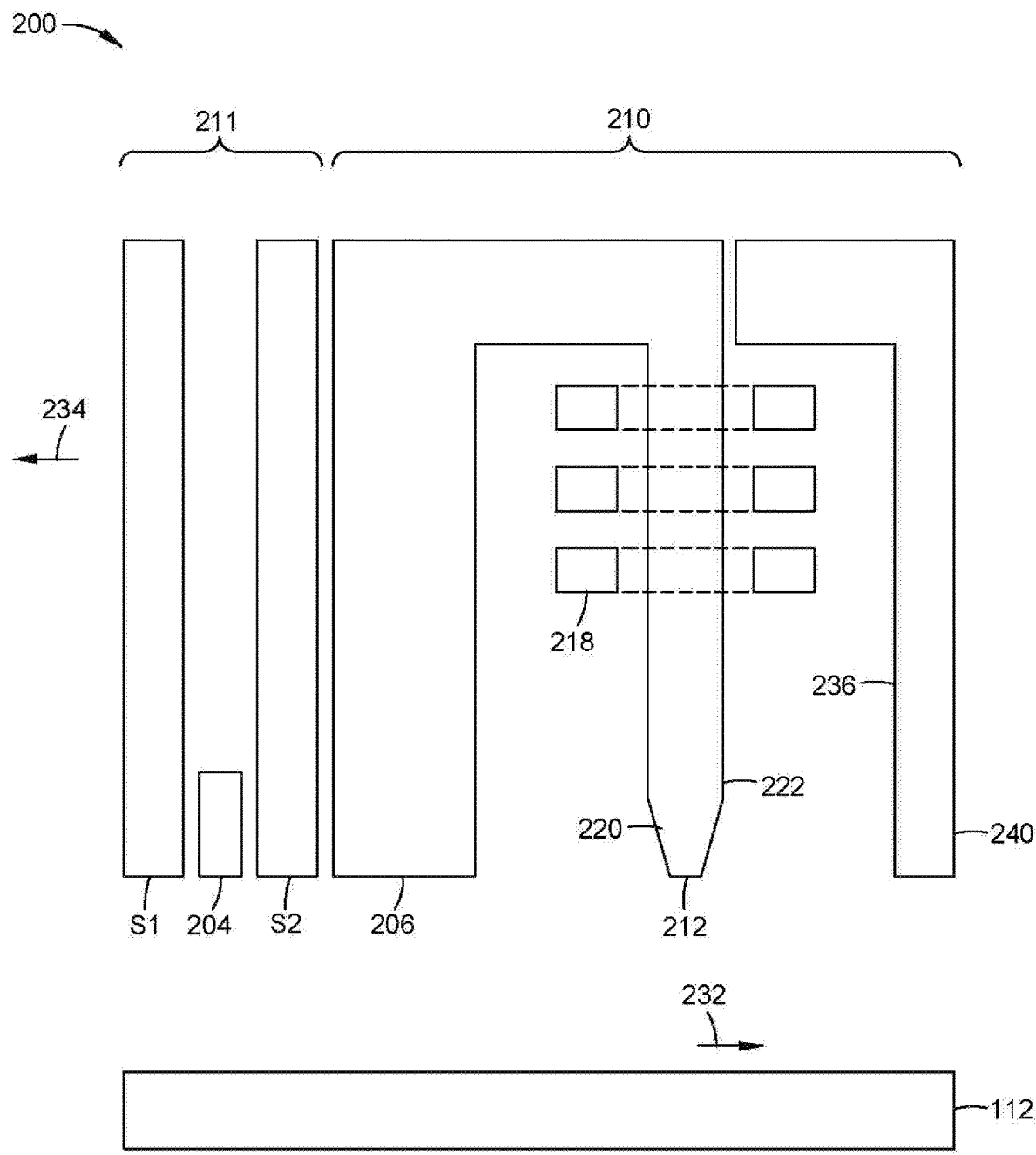
FIG. 2 is a fragmented, cross-sectional side view through the center of a read/write head facing a magnetic media, according to one embodiment.

FIG. 2 is a fragmented, cross sectional side view through the center of a read/write head 200 facing the magnetic media 112, according to one embodiment. The read/write head 200 may correspond to the magnetic head assembly 121 described in FIG. 1. The read/write head 200 includes a media facing surface (MFS) 212, such as an air bearing surface (ABS), a magnetic write head 210, and a magnetic read head 211, and is mounted such that the MFS 212 is facing the magnetic media 112. The read/write head 200 may be an energy-assisted magnetic recording (EAMR) head. In FIG. 2, the magnetic media 112 moves past the write head 210 in the direction indicated by the arrow 232 and the read/write head 200 moves in the direction indicated by the arrow 234.

In some embodiments, the magnetic read head 211 is a SOT differential reader 204 located between the shields S1 and S2. In other embodiments, the magnetic read head 211 is a magnetoresistive (MR) read head that includes an MR sensing element 204 located between MR shields S1 and S2. In some other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap. A recording magnetic field is generated from the main pole 220 and the trailing shield 240 helps making the magnetic field gradient of the main pole 220 steep. The main pole 220 may be a magnetic material such as a FeCo alloy. The main pole 220 may include a trailing surface 222 which may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 T and a thickness of about 300 nanometers (nm). The main pole 220 may comprise ferromagnetic materials, typically alloys of one or more of Co, Fe and Ni. The trailing shield 240 may be a magnetic material such as NiFe alloy. In one embodiment, the trailing shield 240 has an Ms of about 1.2 T to about 1.6 T.

Figure 3C:
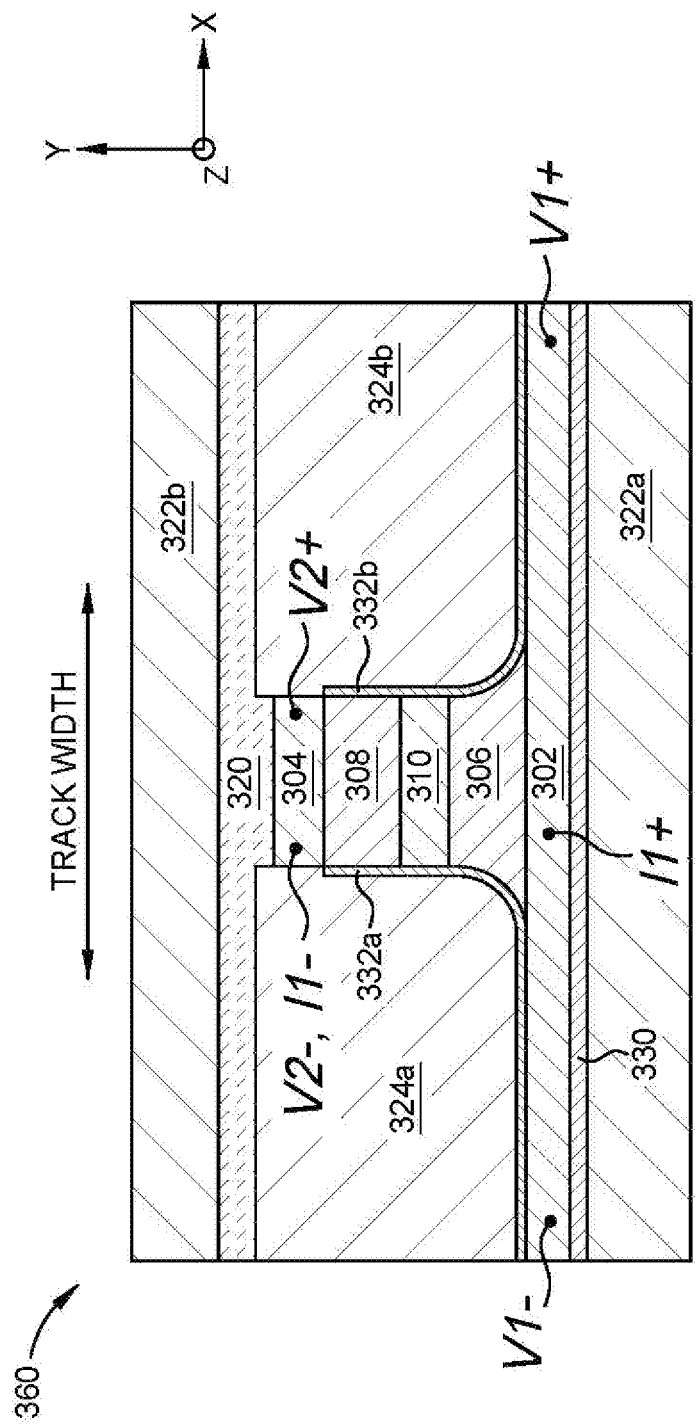

FIGS. 3A-3E illustrate a SOT differential reader, according to one embodiment. FIGS. 3A and 3B illustrate the configuration of the SOT differential reader 300A, 300B, according to various embodiments. The SOT differential reader 300 may be the SOT differential reader 204 located between the two shields S1 and S2 of FIG. 2. Each of FIGS. 3A and 3B has: (1) a top stack configuration view of the reader and (2) a bottom abstract view showing the positioning of the free layers relative to a magnetic media when the recording head is over the media, with the other layers in the stack configuration omitted. As shown in the top stack configuration view of FIGS. 3A and 3B, a first free layer (FL) 306 is deposited on a first spin hall effect (SHE) layer 302a, 302b (collectively referred to as first SHE layer 302), a gap layer (GL) 310 is deposited on the first FL 306, a second FL 308 is deposited on the GL 310, and a second SHE layer 304a, 304b (collectively referred to as second SHE layer 304) is deposited on the second FL 308. In the descriptions herein, the plurality of SHE layers may be referred to as a plurality of spin hall layers (SHLs) for exemplary purposes. The SOT differential reader 300 may have a stripe height of between about 100 Angstroms to about 400 Angstroms.

In the bottom view, the first FL 306 and the second FL 308 are shown rotated 90 degrees from the stack configuration view above, and are positioned perpendicularly over the magnetic media 312, where the magnetic media 312 may be the magnetic media 112 of FIG. 1. The first FL 306 and the second FL 308 are parallel with the magnetic field direction of the magnetic media 312. The magnetic media 312 includes a first magnetic field direction, indicated by a first arrow pointing up in bits 314a and 314c, and a second magnetic field direction, indicated by a second arrow pointing down in bits 314b and 314d. The magnetic media 312 further includes a first bit 314a with a first magnetic field direction, a second bit 314b with a second magnetic field direction, a third bit 314c with the first magnetic field direction, and a fourth bit 314d with the second magnetic field direction. While four bits 314a-314d are shown, the magnetic media may have any number of bits.

In the top stack configuration view of FIG. 3A, a positive end 305b of the first SHL 302a is electrically connected to a positive end 305b of the second SHL 304a, and a negative end 305a of the first SHL 302a is electrically connected to a negative end 305a of the second SHL 304a. Referring to the bottom abstract view, when the first and the second FLs 306, 308, respectively, are both positioned over a single bit of the plurality of bits 314a-314d, such as the third bit 314c, of the magnetic media 312, the magnetic field of the third bit 314c imposes a magnetic force on the first and the second FLs 306, 308. As a result of the magnetic force imposed on the first and the second FLs 306, 308, the magnetic moment of the first and the second FLs 306, 308 are both in the same direction as the magnetic field of the third bit 314c.

In the top stack configuration view of FIG. 3B, a positive end 309b of the first SHL 302b is electrically connected to a negative end 307a of the second SHL 304b, and a negative end 309a of the first SHL 302b is electrically connected to a positive end 307b of the second SHL 304b. Referring to the bottom abstract view, when the first and the second FLs 306, 308, respectively, are each positioned over adjacent bits of the plurality of bits 314a-314d, such as the second bit 314b and the third bit 314c, of the magnetic media 312, the magnetic field of the second bit 314b imposes a magnetic force on the first FL 306 and the third bit 314c imposes a magnetic force on the second FL 308, which is opposite to the magnetic force imposed on the first FL 306. As a result of the magnetic force imposed on the first FL 306 and the second FL 308, the magnetic moment of the first FL 306 is in the same direction as the magnetic field of the second bit 314b and the magnetic moment of the second FL 308 is in the same direction as the magnetic field of the third bit 314c. In FIG. 3B, because the first and the second FLs 306, 308 are located over adjacent bits of the plurality of bits 314a-314d of the magnetic media 312, the first FL 306 has a magnetic field direction opposite of the second FL 308 magnetic field direction.

In FIGS. 3A and 3B, the first SHL 302 and the second SHL 304 each comprises the same material and has the same thickness in the y-direction. The first and the second SHLs 302, 304 may be formed by a non-magnetic heavy metal material selected from a group that includes Ta, Pt, W, Hf, Bi, and alloys thereof. Additionally, it is to be understood that while Ta, Pt, W, Hf, Bi, and alloys thereof have been exemplified as the materials of the first and the second SHLs 302, 304, other materials are contemplated, and the embodiments discussed herein are not limited. For example, BiSb and BiSe may be used as the material for the first and the second SHLs 302, 304. The first and the second SHLs 302, 304 may have a greater width than the first and second FL layers 306, 308 and the GL 310. In one embodiment, the first and second SHLs 302, 304 have the same width. In another embodiment, the first and second SHLs 302, 304 have different widths.

In FIG. 3A, the first SHL 302a and the second SHL 304a each generates a lateral voltage signal (i.e., a SHE signal) inside each respective first and second SHLs 302a, 304a. The generated lateral voltage signal may be due to the spin hall effect. The lateral voltage signal direction may depend on the electron current flow direction and the magnetic orientation of the first and second FLs 306, 308. For example, in the bottom view of FIG. 3A, the first and second FLs 306, 308 are each positioned perpendicularly over the same bit, such as the third bit 314c. The first and second SHLs 302a, 304a have the same SHE voltage polarity, where the side in the −x-direction is a negative pole 305a and the side in the x-direction is a positive pole 305b.

Furthermore, the negative poles 305a of the first and the second SHLs 302a, 304a are connected, such that the negative poles 305a of the first and the second SHLs 302a, 304a share an equal voltage potential. The reader signal output may be determined by the voltage difference or the differential voltage 311 between the positive poles 305b of the first and the second SHLs 302a, 304a. Because the first and the second SHLs 302a, 304a each includes the same materials and the same current flow direction, the SHE voltage induced by the first SHL 302a may be equal in both polarity and magnitude to the SHE voltage induced by the second SHL 304a. The differential voltage 311 between the two positive poles 305b may be either canceled or reduced. The differential voltage 311 may be a net differential output or about zero. A current 313 travels from the first SHL 302a to the GL 310. The current 313 travels from the GL 310 to the second SHL 304a. As such, the SOT differential reader 300A is a multi-terminal device. Because the first and the second SHLs 302a, 304a have the same voltage polarity, the signal output will be greatly reduced.

In the bottom view of FIG. 3B, the first FL 306 and the second FL 308 are located over adjacent bits, such as the first FL 306 is positioned perpendicularly over the second bit 314b and the second FL is positioned perpendicularly over the third bit 314c. The first and the second FLs 306, 308 have different and opposite magnetization. For example, the first SHL 302b has a first SHE voltage, where the side in the −x-direction is a positive pole 309b and the side in the x-direction is a negative pole 309a. Likewise, the second SHL 304b has a second SHE voltage, where the side in the −x-direction is a negative pole 307a and the side in the x-direction is a positive pole 307b. Furthermore, the positive pole 309b of the first SHL 302b and the negative pole 307a of the second SHL 304b are connected and share an equal voltage potential. The differential voltage 311 is determined by the difference between the voltage of the positive pole 307b of the second SHL 304b and the voltage of the negative pole 309a of the first SHL 302b. Because the induced voltage directions of the first and the second SHLs 302b, 304b are opposite of each other, the differential voltage 311 may effectively double the output signal. A current 313 travels from the first SHL 302b to the GL 310. The current 313 then travels from the GL 310 to the second SHL 304b. As such, the SOT differential reader 300B is a multi-terminal device. Because the first and the second SHLs 302b, 304b have opposite voltage directions, the signal output may be effectively doubled or greatly increased.

FIG. 3C illustrates a MFS view of a SOT differential reader 360, according to one embodiment. The SOT differential reader 360 may be the SOT differential reader 300A of FIG. 3A and/or the SOT differential reader 300B of FIG. 3B. Furthermore, the first SHLs 302a, 302b may be the first SHL 302 and the second SHLs 304a, 304b may be the second SHE 304.

The SOT differential reader 360 further includes a first shield 322a deposited below a first insulation layer 330, where the first SHL 302 is deposited on the first insulation layer 330. Furthermore, a second insulation layer 332a and a third insulation layer 332b are deposited in contact with surfaces of the first SHL 302, the first FL 306, the GL 310, and the second FL 308. A first hard bias layer 324a is deposited in contact with the second insulation layer 332a and the second SHL 304. A second hard bias layer 324b is deposited in contact with the third insulation layer 332b and the second SHL 304. The second and third insulation layers 332a, 332b prevent the first SHL 302, the first FL 306, the GL 310, and the second FL 308 from directly contacting the first and second hard bias layers 324a, 324b. Furthermore, a fourth insulation layer 320 is deposited on the second SHL 304, the first hard bias layer 324a, and the second hard bias layer 324b. A second shield 322b is deposited on the fourth insulation layer 320. The first SHL 302 has a greater width or length in the x-direction (i.e., a greater track-width in the cross-track direction) than the second SHL 304.

The insulation layers 330, 332a, 332b, 320 are placed in the SOT differential reader 360 such that electrical shorting between the first shield 322a, the first SHL 302, the first FL 306, the GL 310, the second FL 308, the second SHL 304, the second shield 322, the first hard bias layer 324a, and the second hard bias layer 324b may be avoided. Suitable materials for the insulation layers 330, 332a, 332b, 320 include dielectric materials such as aluminum oxide, silicon oxide, magnesium oxide, and silicon nitride. The insulation layers 330, 332a, 332b, 320 may be formed by well-known deposition methods, such as atomic layer deposition (ALD), physical vapor deposition (PVD), ion beam deposition (IBD), or sputtering. The insulation layers 330, 332a, 332b, 320 may have a thickness of between about 10 Angstroms to about 100 Angstroms.

The first FL 306 and the second FL 308 comprise the same material and have a same thickness in the y-direction. The first and the second FLs 306, 308 have a greater thickness in the y-direction than the first and the second SHLs 302, 304. In some embodiments, the first and the second FLs 306, 308 each comprises a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 100 Angstroms, such as between about 3 Angstroms and about 10 Angstroms or between about 10 Angstroms and about 100 Angstroms. The first and the second FLs 306, 308 may be formed by well-known deposition methods, such as sputtering. Additionally, it is to be understood that while CoFe/CoFeB/Ta/NiFe have been exemplified as the materials of the first and the second FLs 306, 308, other materials are contemplated, and the embodiments discussed herein are not limited to CoFe/CoFeB/Ta/NiFe for the first and the second FLs 306, 308. Furthermore, the previously mentioned dimensions are not intended to be limiting, but to provide an example of a possible embodiment.

The GL 310 has a smaller thickness in the y-direction than the first and the second SHLs 302, 304. The GL 310 may be formed by a non-magnetic conducting material such as Cr with a thickness of between about 10 Angstroms to about 50 Angstroms. In some embodiments, the GL 310 may include a thickness of about 0 Angstroms to about 20 Angstroms. It is to be understood that while Cr is exemplified as the GL 310, other materials are contemplated, and the embodiments discussed herein are not limited to Cr for the GL 310. In some embodiments, insulating materials may be used for the GL 310 material, such as when the GL 310 has a thickness of less than about 1 nm.

The first shield 322a and the second shield 322b each comprises an electrically conductive material selected from a group that includes Cu, W, Ta, Al, NiFe, CoFe, and alloys thereof. The shield materials may either include, NiFe alloy, CoFe alloy, or a combination of NiFe alloy or CoFe alloy with Cu, W, Ta, and Al. The thickness of each of the first shield 322a and the second shield 322b may be between about 20 nm and about 500 nm. Additionally, it is to be understood that while NiFe, CoFe, Cu, W, Ta, Al, and alloys thereof have been exemplified as the first shield 322a and the second shield 322b materials, other materials are contemplated, and the embodiments discussed herein are not limited to NiFe, CoFe, Cu, W, Ta, Al, or alloys thereof for the first shield 322a and the second shield 322b.

The first hard bias layer 324a and the second hard bias layer 324b may comprise a multilayer structure comprising a seed layer(s) and a bulk layer. In one embodiment, the hard bias layer includes a Ta seed layer, a Cr or a W seed layer disposed on the Ta seed layer, and a CoPt bulk layer disposed on the Cr or the W seed layer. In some embodiments, the hard bias layer includes a multilayer of the previously mentioned materials. Additionally, it is to be understood that while Ta, Cr, W, and CoPt have been exemplified as the first hard bias layer 324a and the second hard bias layer 324b materials, other materials are contemplated, and the embodiments discussed herein are not limited to Cu, Ta, Cr, W, and CoPt for the first hard bias layer 324a and the second hard bias layer 324b.

Electrical leads are placed about the first SHL 302 and the second SHL 304. For example, the first SHL 302 comprises a first negative voltage terminal (V1−), a first positive voltage terminal (V1+), and a first positive current terminal (I1+). In another example, the second SHL 304 includes a first negative current terminal (I2−), a second positive voltage terminal (V2+), and a second negative voltage terminal (V2−). It is to be understood that the illustrated polarity of the voltage terminals of the first and the second SHLs 302, 304 are for exemplary purposes and the voltage polarity of the first and second SHLs 302, 304 may depend on the positioning of the first and the second FLs 306, 308 relative to the bits, such as the bits 314a-314d, of the magnetic media 312. Furthermore, the first negative voltage terminal (e.g., V1−) and the second negative voltage terminal (e.g., V2−) may be electrically shorted together as to provide a common voltage terminal. The differential voltage (e.g., the differential voltage 311) between the first positive voltage terminal of the first SHL 302 and the second positive voltage terminal of the second SHL 304 is the SOT differential reader signal output.

FIG. 3D illustrates a MFS view of a SOT differential reader 370, according to another embodiment. The SOT differential reader 370 may be the SOT differential reader 300A of FIG. 3A and/or the SOT differential reader 300B of FIG. 3B. Furthermore, the first SHLs 302a, 302b may be the first SHL 302 and the second SHLs 304a, 304b may be the second SHL 304. Aspects of the SOT differential reader 370 are similar to the SOT differential reader 360 of FIG. 3C, and the reference numerals of elements of FIGS. 3C-3D are consistent to reflect this.

The SOT differential reader 370 further includes an antiferromagnetic (AFM)/capping layer 326 deposited between a first soft bias layer 324c, a second soft bias layer 324d, and the fourth insulation layer 320. The AFM/capping layer 326 comprises a material selected from a group of AFM materials that includes IrMn, FeMn, PtMn, and other non-magnetic conducting layers. Furthermore, the AFM/capping layer 326 may comprise a group of AFM materials and one or more materials from a group that includes Ta, Ru, or Ti, other non-magnetic materials, and/or their multilayers. The AFM/capping layer 326 may be formed by well-known deposition methods, such as sputtering. The AFM/capping layer 326 may have a thickness of between about 40 Angstroms to about 150 Angstroms. Additionally, it is to be understood that while IrMn, FeMn, PtMn, Ta, Ru, Ti and their multilayers have been exemplified as the AFM/capping layer 326 materials, other materials are contemplated and the embodiments discussed herein are not limited to IrMn, FeMn, PtMn, Ta, Ru, or Ti or their multilayers for the AFM/capping layer 326.

The first SHL 302 has a first track width 318 that is substantially equal to or less than the width of the first shield 322a, and the second SHL 304 has a second track width 328 that is substantially equal to the width of the stack that includes the first FL 306, the GL 310, and the second FL 308. In some embodiments, the first track width 318 has a width that is less than the width of the first shield 322a. The first track width 318 may be about 200 Angstroms to about 2000 Angstroms wide. The second track width 328 may be about 100 Angstroms to about 400 Angstroms wide.

Electrical leads are placed about the first SHL 302 and the second SHL 304. For example, the first SHL 302 includes a first negative voltage (V1−) terminal, a first positive voltage terminal (V1+), and a first positive current terminal (I1+). In another example, the second SHL 304 includes a first negative current terminal (I2−), a second positive voltage terminal (V2+), and a second negative voltage terminal (V2−). It is to be understood that the illustrated polarity of the voltage terminals of the first and the second SHLs 302, 304 are for exemplary purposes and the voltage polarity of the first and second SHLs 302, 304 may depend on the positioning of the first and the second FLs 306, 308 relative to the bits, such as the bits 314a-314d, of the magnetic media 312. Furthermore, the first negative voltage terminal (V1−) and the second negative voltage terminal (V2−) may be electrically shorted together as to provide a common voltage terminal. The differential voltage (e.g., the differential voltage 311) between the first positive voltage terminal of the first SHL 302 and the second positive voltage terminal of the second SHL 304 is the SOT differential reader signal output.

In some embodiments, the first positive voltage terminal (V1+) and the second negative voltage terminal (V2−) may be electrically connected as to provide a common voltage terminal. The differential voltage (e.g., the differential voltage 311) between the first negative voltage terminal of the first SHL 302 and the second positive voltage terminal of the second SHL 304 is the SOT differential reader signal output.

The first soft bias layer 324c and the second soft bias layer 324d may include a multilayer structure comprising soft magnetic materials. In one embodiment, the soft bias layers includes a material selected from a group that includes NiFe, CoFe, CoNi, CoFeNi, CoFeB, Co, alloys thereof, and/or their multilayers. Additionally, it is to be understood that while NiFe, CoFe, CoNi, CoFeNi, CoFeB, Co, alloys thereof, and/or their multilayers have been exemplified as the first soft bias layer 324c and the second soft bias layer 324d materials, other materials are contemplated, and the embodiments discussed herein are not limited to NiFe, CoFe, CoNi, CoFeNi, CoFeB, Co, alloys thereof, and/or their multilayers for the first soft bias layer 324c and the second soft bias layer 324d.

FIG. 3E illustrates a side cross-sectional view of a SOT differential reader 380 showing the stripe height of the layers of the SOT differential reader, according to one embodiment. The SOT differential reader 380 may be the SOT differential reader 360 of FIG. 3C or the SOT differential reader 370 of FIG. 3D. Thus, the materials of layers forming the SOT differential reader 380 are the same as the materials of the SOT differential reader 360 of FIG. 3C or the SOT differential reader 370 of FIG. 3D. The SOT differential reader 380 comprises a first insulation layer 330 deposited on the first shield 322a, a first SHL 302 deposited on the first insulation layer 330, a first FL 306 deposited on the first SHL 302, a GL 310 deposited on the first FL 306, a second FL 308 deposited on the GL 310, and second SHL 304 deposited on the second FL 308. A fourth insulation layer 320 is deposited on the first shield 322a and the second SHL 304, as well as on the backside of the first insulation layer 330, the first SHL 302, the first FL 306, the GL 310, the second FL 308, and the second SHL 304. A second shield 322b is deposited on the fourth insulation layer 320.

Figure 4E:
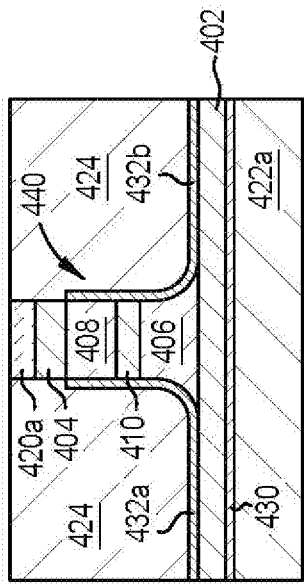

FIGS. 4A-4H illustrate a method of forming and defining a track-width of the SOT differential reader 360 of FIG. 3C, according to one embodiment. While different reference numerals may be used in FIGS. 4A-4H, the materials of the layers forming the SOT differential reader 360 are the same as the materials described in FIG. 3C above. FIGS. 4A-4H illustrate a MFS view of the SOT differential reader 360 as it is being fabricated. In FIG. 4A, a first insulation layer 430 is deposited on a first shield 422a, a first SHL 402 is deposited on the first insulation layer 430, a first FL 406 is deposited on the first SHL 402, a GL 410 is deposited on the first FL 406, a second FL 408 is deposited on the GL 410, a second SHL 404 is deposited on the second FL 408, and a second insulation layer 420a is deposited on the second SHL 404 to form a stack 440.

In FIG. 4B, a photoresist or photo stencil 434 is deposited over the stack 440 on the second insulation layer 420a to define a track-width of the stack 440. The portions of the second insulation layer 420a, the second SHL 404, the second FL 408, the GL 410, and the first FL 406 uncovered by the photo stencil 434 are then removed (i.e., the outer ends of stack 440) to reveal refill layers 436a, 436b disposed behind the stack 440. The removal of the outer ends of the stack 440 defines the track-width or the horizontal width of the stack 440. In FIG. 4C, a thin layer of insulation material 432 is deposited on a top surface 402a of the first SHL 402 and on either side of the first FL 406, the GL 410, the second FL 408, the second SHL 404, the second insulation layer 420a, and the photo stencil 434 (e.g., the sides in contact with the refill layers 436a, 436b).

In FIG. 4D, hard bias layers 424a, 424b are deposited over the first SHL 402 (e.g., on the insulating material 432) and on both sides of the first FL 406, the GL 410, and the second FL 408. The portions of the insulation material 432 and the refill layers 436a, 436b disposed in contact with the second SHL 404, the second insulation layer 420a, and the photo stencil 434 are then removed, for example by ion milling. Thus, a third insulation layer 432a and a fourth insulation layer 432b remain in contact with the first SHL 402, the first FL 406, the GL 410, and the second FL 408 such that the third and fourth insulation layers 432a, 432b are disposed between the first SHL 402, the first FL 406, the GL 410, and the second FL 408 and the hard bias layers 424a, 424b. In other words, the first SHL 402, the first FL 406, the GL 410, and the second FL 408 are not in direct contact with the hard bias layers 424a, 424b. A first hard bias material 424a is deposited on the third insulation layer 432a to a level below the second SHL 404 and a second hard bias material is deposited on the fourth insulation layer 432b to a level below the second SHL 404. In one embodiment, the level is in line with the bottom edge of the second SHL 404.

Figure 4F:
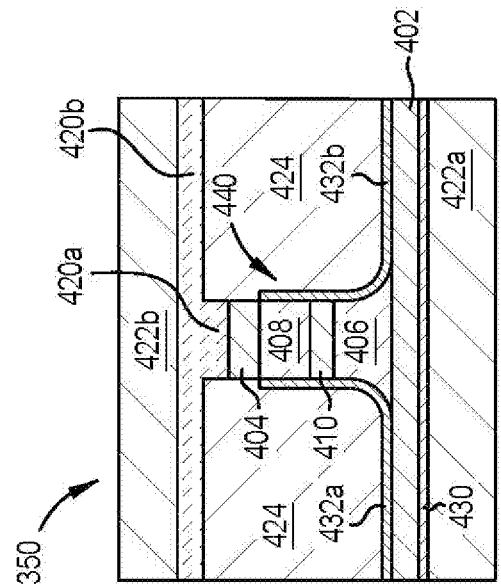

In FIG. 4E, additional hard bias material 424c is deposited around and in contact with the second SHL 404, the second insulation layer 420a, and the photo stencil 434. The additional hard bias material 424c and the hard bias layers 424a, 424b form a cohesive hard bias layer, and are collectively referred to as hard bias layers 424 or hard bias material 424. In FIG. 4F, the photo stencil 434 and a portion of the hard bias layer 424 in contact with the photo stencil 434 are removed by a process such as CMP assisted liftoff.

Figure 4G:
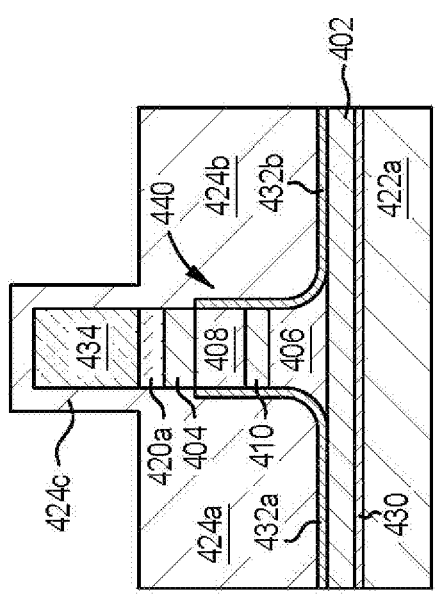
Figure 4H:
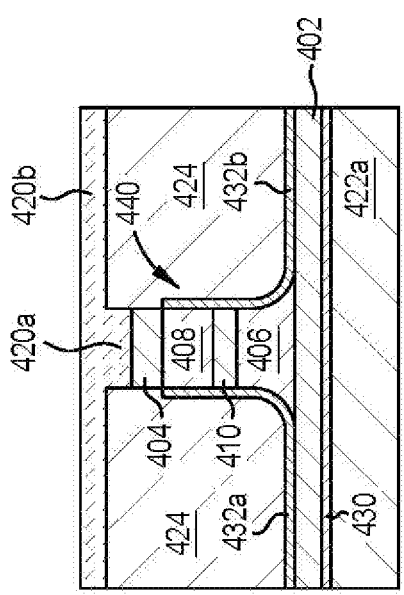

In FIG. 4G, after defining the track-width and the stripe height of the SOT differential reader 360 though the previously discussed steps, a fourth insulation layer 420b is deposited on and in contact with the second insulation layer 420a and the hard bias layer 424. In FIG. 4H, a second shield 422b is deposited on and in contact with the fourth insulation layer 420b. In one embodiment, the first and second shields 422a, 422b comprise the same or similar materials. In another embodiment, the first and second shields 422a, 422b comprise different materials.

Figure 5B:
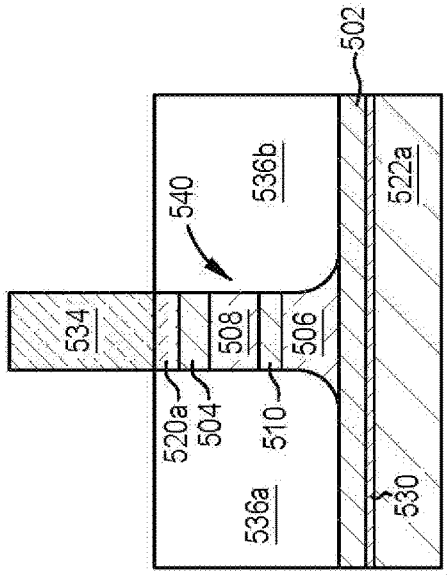
Figure 5D:
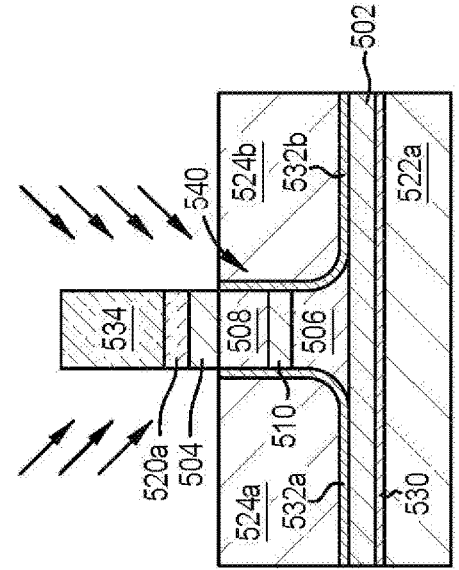
Figure 5A:
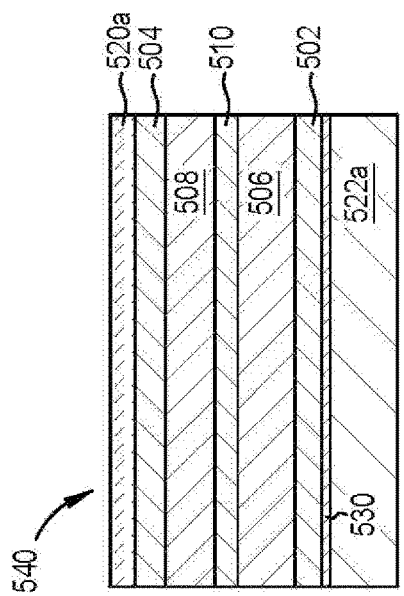

FIGS. 5A-5H illustrate a method of forming and defining a track-width of the SOT differential reader 370 of FIG. 3D, according to one embodiment. FIGS. 5A-5H illustrate a MFS view of the SOT differential reader 370 as it is being fabricated. While different reference numerals may be used in FIGS. 5A-5H, the materials of the layers forming the SOT differential reader 370 are the same as the materials described in FIG. 3D above. In FIG. 5A, a first insulation layer 530 is deposited on a first shield 522a, a first SHL 502 is deposited on the first insulation layer 530, a first FL 506 is deposited on the first SHL 502, a GL 510 is deposited on the first FL 506, a second FL 508 is deposited on the GL 510, a second SHL 504 is deposited on the second FL 508, and a second insulation layer 520a is deposited on the second SHL 504 to form a stack 540.

Figure 5C:
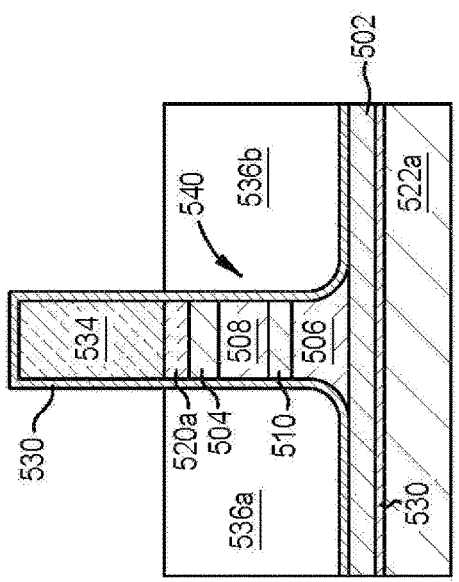

In FIG. 5B, a photoresist or photo stencil 534 is deposited over the stack 540 on the second insulation layer 520a to define a track-width of the stack 540. The portions of the second insulation layer 520a, the second SHL 504, the second FL 508, the GL 510, and the first FL 506 uncovered by the photo stencil 534 are then removed (i.e., the outer ends of stack 540) to reveal refill layers 536a, 536b disposed behind the stack 540. The removal of the out ends of the stack 540 defines the track-width or the horizontal width of the stack 540. In FIG. 5C, a thin layer of insulation material 532 is deposited on a top surface 502a of the first SHL 502 and either side of the first FL 506, the GL 510, the second FL 508, the second SHL 504, the second insulation layer 520a, and the photo stencil 534.

In FIG. 5D, side shield layers 524c, 524d are deposited over the first SHL 502 (e.g., on the insulating material 532) and on both sides of the first FL 506, the GL 510, and the second FL 508. The side shield layers 524c, 524d may comprise a soft bias material. The portions of the insulation material 532 and the refill layers 536a, 536b disposed in contact with the second SHL 504, the second insulation layer 520a, and the photo stencil 534 are then removed, for example by milling. Thus, a third insulation layer 532a and a fourth insulation layer 532b remain in contact with the first SHL 502, the first FL 506, the GL 510, and the second FL 508 such that the third and fourth insulation layers 532a, 532b are disposed between the first SHL 502, the first FL 506, the GL 510, and the second FL 508 and the side shield layers 524c, 524d. In other words, the first SHL 502, the first FL 506, the GL 510, and the second FL 508 are not in direct contact with the side shield layers 524*c*, 524*d*.

In FIG. 5E, an AFM/capping layer 536 is deposited on the side shield layers 524*c*, 524*d*, and around and in contact with the second SHL 504, the second insulation layer 520*a*, and the photo stencil 534. The AFM/capping layer 536 includes a material selected from a group of AFM materials that includes IrMn, FeMn, PtMn, and other non-magnetic conducting layers. Furthermore, the AFM/capping layer 536 may comprise a group of AFM materials and one or more materials from a group that includes Ta, Ru, or Ti, other non-magnetic, electrically conductive materials and their multilayers. The AFM/capping layer 536 may be formed by well-known deposition methods such as sputtering. The AFM/capping layer 536 may have a thickness of between about 40 Angstroms to about 150 Angstroms. Additionally, it is to be understood that while IrMn, FeMn, PtMn, Ta, Ru, Ti and their multilayers have been exemplified as the AFM/capping layer 536 materials, other materials are contemplated and the embodiments discussed herein are not limited to IrMn, FeMn, PtMn, Ta, Ru, or Ti or their multilayers for the AFM/capping layer 536. In FIG. 5F, the photo stencil 534 and a portion of the AFM/capping layer 536 in contact with the photo stencil 534 are removed by a process such as CMP assisted liftoff.

In FIG. 5G, after defining the track-width and the stripe height of the SOT differential reader 370 though the previously discussed steps, a fourth insulation layer 520*b* is deposited on and in contact with the second insulation layer 520*a* and AFM/capping layer 536. In FIG. 5H, a second shield 522*b* is deposited on and in contact with the fourth insulation layer 520*b*. In one embodiment, the first and second shields 522*a*, 522*b* comprise the same or similar materials. In another embodiment, the first and second shields 522*a*, 522*b* comprise different materials.

FIGS. 6A-6E illustrate a method of forming and defining a stripe height of the SOT differential reader 380 of FIG. 3E, according to one embodiment. FIGS. 6A-6E illustrate a side cross-sectional view of the SOT differential reader 380. While different reference numerals may be used in FIGS. 6A-6E, the materials of the layers forming the SOT differential reader 380 are the same as the materials described in FIG. 3E above. In FIG. 6A, a first insulation layer 630 is deposited on a first shield 622*a*, a first SHL 602 is deposited on the first insulation layer 630, a first FL 606 is deposited on the first SHL 602, a GL 610 is deposited on the first FL 606, a second FL 608 is deposited on the GL 610, a second SHL 604 is deposited on the second FL 608, and a second insulation layer 620*a* is deposited on the second SHL 604 to form a stack 640.

In FIG. 6B, a first photoresist or photo stencil 634*a* is deposited over the stack 640 on the second insulation layer 620*a* to define a stripe height (i.e., in the z-direction) of the stack 640. The portions of the second insulation layer 620*a*, the second SHL 604, the second FL 608, the GL 610, and the first FL 606 uncovered by the photo stencil 634*a* are then removed (i.e., the back end of stack 640 recessed from the MFS 650) to reveal the first insulation layer 630 disposed on the first shield 622*a*. In FIG. 6C, the first photo stencil 634*a* is removed, and a third insulation layer 620*b* is deposited on a backside surface 640*a* of the stack 640 (i.e., a surface 640*a* of the stack 640 recessed from the MFS 650) on the first insulation layer 630. The third insulation layer 620*b* is deposited to the removed portion of the stack 640 recessed from the MFS 650. The third insulation layer 620*b* is in contact with the first SHL 602, the first FL 606, the GL 610, the second FL 608, the second SHL 604, and the second insulation layer 620*a*. The stack 640 then forms an electrical lead for the SOT differential reader 380.

Upon depositing the third insulation layer 620*b*, the track-width of the stack 640 may then be defined, such as described above in FIGS. 4B-4H and FIGS. 5B-5H. Once the track-width of the stack 640 is defined, a second photo stencil 634*b* is deposited on the second and third insulation layers 620*a*, 620*b*, as shown in FIG. 6D, to expose the electrical contacts. Portions of the stack 640 and/or third insulation layer 620*b* are then etched, such as by an alumina wet etch, to open one or more electrical lead connections. In FIG. 6E, a second shield 622*a* is deposited on and in contact with the second and third insulation layers 620*a*, 620*b*. In one embodiment, the first and second shields 622*a*, 622*b* comprise the same or similar materials. In another embodiment, the first and second shields 622*a*, 622*b* comprise different materials.

FIGS. 7A-7B illustrate a SOT differential reader 700, according to one embodiment. A first FL 706 is deposited on a first shield 722*a*, a first SHL 702 is deposited on a first FL 706, a GL 710 is deposited on the first SHL 702, a second SHL 704 is deposited on the GL 710, and a second FL 708 is deposited on the second FL 708.

In FIG. 7A, a first insulation layer 732*a* is located on a first side of the first FL 706 adjacent to the first bias layer 724*c* and a second insulation layer 732*b* is located on a second side of the first FL 706 adjacent to the second bias layer 724*d*, where the second side is opposite of the first side. A third insulation layer 732*c* is located on the first side of the second FL 708 adjacent to the first bias layer 724*c*, and a fourth insulation layer 732*d* is located second side of the second FL 708 adjacent to the second bias layer 724*d*. Furthermore, the first bias layer 724*c* is deposited over the first shield 722*a* and is in contact with the first insulation layer 732*a*, the first SHL 702, the GL 710, the second SHL 704, and the third insulation layer 732*c*. A second bias layer 724*d* is deposited over the first shield 722*a* and is in contact with the second insulation layer 732*b*, the first SHL 702, the GL 710, the second SHL 704, and the fourth insulation layer 732*d*. In one embodiment, the first and second bias layers 724*c*, 724*d* are soft bias layers.

In FIGS. 7A and 7B, an AFM/capping layer 726 is deposited on the first bias layer 724*c* and the second bias layer 724*d*. A fifth insulation layer 720 is deposited on the second FL 708 and the AFM/capping layer 726. In one embodiment, the third insulation layer 732*c* and the fourth insulation layer 732*d* are located between the AFM/capping layer 726 and the fifth insulation layer 720. A second shield 722*b* is deposited on the fifth insulation layer 720. In some embodiments, the SOT differential reader 700 may not include the AFM/capping layer 726 and the first and the second bias layers 724*c*, 724*d* are hard bias layers.

The insulation layers 732*a*-732*d*, 720 are placed in the SOT differential reader 700 such that electrical shorting between the first shield 722*a*, the first SHL 702, the first FL 706, the GL 710, the second FL 708, the second SHL 704, the AFM/capping layer 726, the second shield 722, the first bias layer 724*c*, and the second bias layer 724*d* may be avoided. Suitable materials for the insulation layers 732*a*-732*d*, 720 include dielectric materials such as aluminum oxide, silicon oxide, magnesium oxide, and silicon nitride. The insulation layers 732*a*-732*d*, 720 may be formed by well-known deposition methods such as atomic layer deposition (ALD), physical vapor deposition (PVD), ion beam deposition (IBD), or sputtering. The insulation layers 732*a*-732*d*, 720 may have a thickness of between about 10 Angstroms to about 100 Angstroms.

The first FL 706 and the second FL 708 comprise the same material and have a same thickness in the y-direction. The first and the second FLs 706, 708 have a greater thickness in the y-direction than the first and the second SHLs 702, 704. The first and the second FLs 706, 708 each includes a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 100 Angstroms, such as between about 3 Angstroms and about 10 Angstroms or between about 10 Angstroms and about 100 Angstroms. The first and the second FLs 706, 708 may be formed by well-known deposition methods such as sputtering. Additionally, it is to be understood that while CoFe/CoFeB/Ta/NiFe have been exemplified as the materials of the first and the second FLs 706, 708, other materials are contemplated, and the embodiments discussed herein are not limited to CoFe/CoFeB/Ta/NiFe for the first and the second FLs 706, 708. Furthermore, the previously mentioned dimensions are not intended to be limiting, but to provide an example of a possible embodiment.

The GL 710 has a smaller thickness in the y-direction than the first and the second SHLs 702, 704. The GL 710 may be formed by a material such as MgO or Cr with a thickness of between about 0 Angstroms to about 20 Angstroms. It is to be understood that while MgO and Cr are exemplified as the GL 710, other insulating materials are contemplated, and the embodiments discussed herein are not limited to MgO and Cr for the GL 710. In some embodiments, the SOT differential reader 700 does not include the GL 710 or the GL 710 has a thickness of about zero Angstroms.

The first shield 722a and the second shield 722b each comprises an electrically conductive material selected from a group that includes Cu, W, Ta, Al, NiFe, CoFe, and alloys thereof. The shield materials may either include, NiFe alloy, CoFe alloy, or a combination of NiFe alloy or CoFe alloy with Cu, W, Ta, Al, NiFe, CoFe. The thickness of each of the first shield 722a and the second shield 722b may be between about 20 nm and about 500 nm. Additionally, it is to be understood that while Cu, W, Ta, Al, NiFe, CoFe, and alloys thereof have been exemplified as the first shield 722a and the second shield 722b materials, other materials are contemplated, and the embodiments discussed herein are not limited to Cu, W, Ta, Al, NiFe, CoFe, or alloys thereof for the first shield 722a and the second shield 722b.

Electrical leads are placed about the first shield 722a, the second shield 722b, the first bias layer 724c, and the second bias layer 724d. For example, the first shield 722a includes a first positive current terminal (I1+) and the second shield 722b includes a second positive current terminal (I2+). When current (I−) is introduced at the GL 710 from either the first bias layer 724c or the second bias layer 724d (e.g., the negative current terminal shown in the second bias layer 724d), the current splits and flows towards the first positive current terminal and the second positive current terminal. The signal output of the SOT differential reader 700 is the voltage difference between the negative voltage terminal (V−) and the positive voltage terminal (V+) of the first SHL 702. Because the direction of the current flow of the first FL 706 and the second FL 708 are opposite to each other, the induced SHE spin hall voltage along the first and second SHLs 702, 704 will have the same polarity or the opposite polarity depending on the magnetization of the first and the second FLs 706, 708.

The differential signal output between the negative voltage terminal and the positive voltage terminal across either the first SHL 702 or the second SHL 704 depends on the positioning of the first and the second FLs 706, 708 relative to the bits, such as the bits 314a-314d of the magnetic media 312 of FIG. 3. For example, if the first and the second FLs 706, 708 are positioned perpendicularly over a single bit, the differential signal output is canceled out or about zero. However, if the first FL 706 is positioned perpendicularly over a first bit, with an opposite magnetic force orientation, and the second FL 708 is positioned perpendicularly over a second bit that is adjacent to the first bit, then the differential signal output is added together or may be effectively doubled.

Figure 8A:
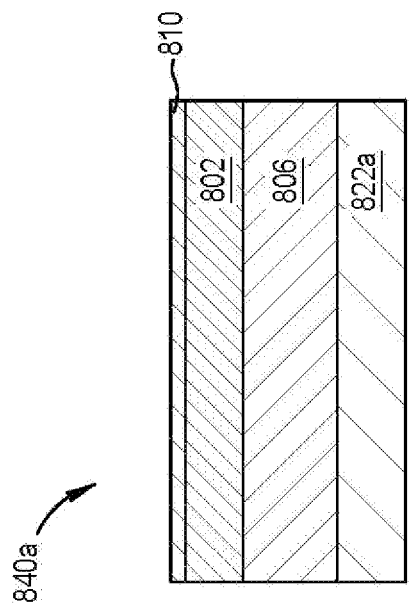

FIGS. 8A-8L illustrate a method of forming and defining a track-width of the SOT differential reader 700 of FIG. 7A, according to one embodiment. FIGS. 8A-8L illustrate an MFS view of the SOT differential reader 700 as it is being fabricated. While different reference numerals may be used in FIGS. 8A-8L, the materials of the layers forming the SOT differential reader 700 are the same as the materials described in FIGS. 3D and 7A above. In FIG. 8A, a first SHL 802 is deposited on a first shield 822a, a first FL 806 is deposited on the first SHL 802, and a GL 810 is deposited on the first FL 806 to form a first portion 840a of stack 840.

Figure 8B:
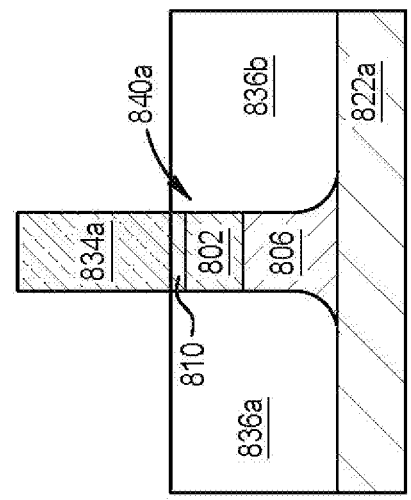
Figure 8C:
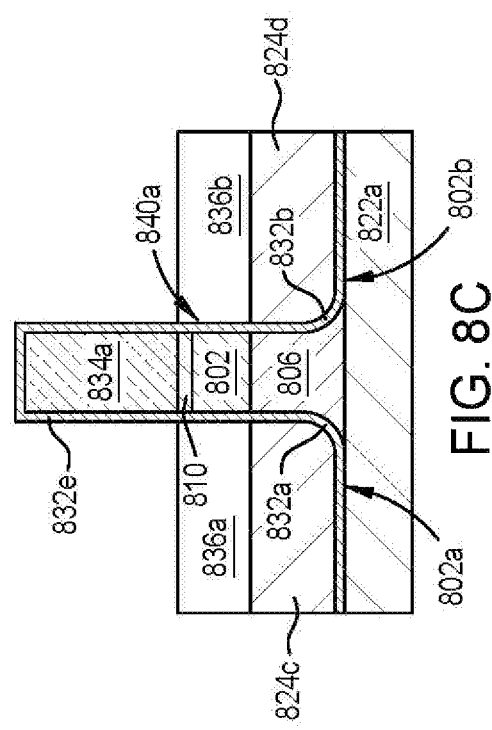
Figure 8D:
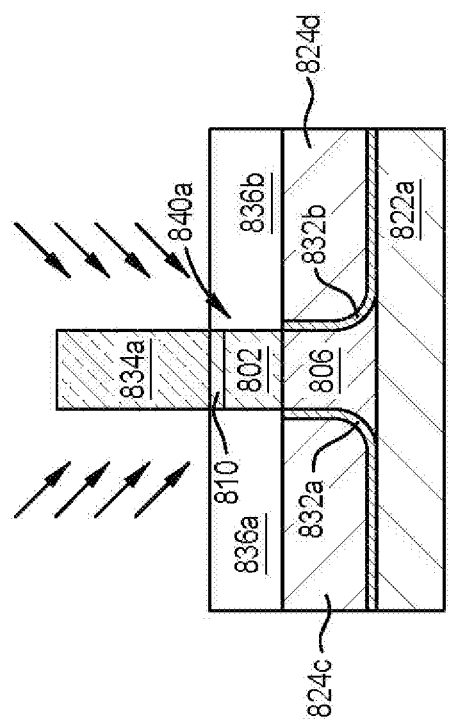

In FIG. 8B, a first photoresist or photo stencil 834a is deposited over the first stack portion 840a on the GL 810 to define a track-width of the first stack portion 840a. The portions of the GL 810, the first SHL 802, and the first FL 806 uncovered by the first photo stencil 834a are then removed (i.e., the outer ends of the first stack portion 840a) to reveal refill layers 836a, 836b disposed behind the first stack portion 840a. The removal of the out ends of the first stack portion 840a defines the track-width or the horizontal width of the first stack portion 840a. In FIG. 8C, a thin layer of insulation material 832a, 832b is deposited over a first top surface 802a and the second top surface 802b of the first shield 822a and around the first FL 806, and the GL 810. Another thin layer of insulation material 832e is disposed around the first photo stencil 834a. Furthermore, a first soft bias layer 824c and a second soft bias layer 824d are deposited over the insulation layers 832a, 832b and in front of the refill layers 836a, 836b. The insulation layers 832a, 832b disposed in contact with the first SHL 802, the first FL 806, and the GL 810 are removed, such as by milling. In FIG. 8D, the thin layer of insulation material 832 is removed, such as by milling.

In FIG. 8E, the first photo stencil 834a is removed and additional first soft bias layer 824c and second soft bias layer 824d materials are deposited around in in contact with the first SHL 802 and the GL 810. In FIG. 8F, additional GL 810 is optionally deposited on the remaining GL 810 and the soft bias layers 824c, 824d (collectively referred to as soft bias layers 824). A second SHL 804 is deposited on the GL 810. A second FL 808 is deposited on the second SHL 804, and a second insulation layer 820a is deposited on the second FL 808. A second photo stencil 834b is deposited over the second stack portion 840b on the second insulation layer 820a define a track-width of the second stack portion 840b. The track-width of the second stack portion 840b is equal to the track-width of the first stack portion 840a.

In FIG. 8G, additional insulation material 832f is deposited on the exposed top surface of the first and the second soft bias layers 824c, 824d, and surrounding the second stack portion 840b and the second photo stencil 834b. The portions of the GL 810, the second SHL 804, and the second FL 808, and the second insulation layer 820a uncovered by the second photo stencil 834b (i.e., the outer ends of the second stack portion 840b) are then removed. The remaining portion of the second stack portion 840b and the first stack portion 840a collectively form the stack 840.

In FIG. 8H, the additional insulation material 832f located on top of the second photo stencil 834b is removed such that a first insulation layer 832c remains disposed on one side of the second stack portion 840b and a second insulation layer 832d remains disposed on the opposite side of the second stack portion 840b. In FIG. 8I, additional soft bias layer 824 material is deposited on the previously deposited soft bias layers 824c, 824d, where the top surface of the soft bias layer 824 is in line with the top surface of the second insulation layer 820a. An AFM/capping layer 826 is deposited on the first and the second soft bias layers 824c, 824d and around the thin insulation layers 832c, 832d. Furthermore, the AFM/capping layer 826 is deposited around and on the second photo stencil 834b.

In FIG. 8J, the second photo stencil 834b and a portion of the AFM/capping layer 826 are removed such that a top surface of the AFM/capping layer 826 is aligned with the second insulation layer 820a. In FIG. 8K, an additional second insulation layer 820b is deposited on the second insulation layer 820a to form a uniform second insulation layer 820, as well as over the AFM/capping layer 826. The uniform insulation layer 820 is deposited after the stripe height and the track-width of the SOT differential reader 700 are defined. Portions of the uniform insulation layer 820 may be etched in order to expose the electrical contacts of the SOT differential reader 700, similar to as discussed above in other embodiments. In FIG. 8L, the second shield 822b is deposited on the second insulation layer 820.

FIGS. 9A-9L illustrate a method of forming and defining a track-width of the SOT differential reader 700 of FIG. 7A having hard bias layers, according to one embodiment. FIGS. 9A-9L illustrate a side cross-sectional view of the SOT differential reader 700 as it is being fabricated. While different reference numerals may be used in FIGS. 9A-9L, the materials of the layers forming the SOT differential reader 700 are the same as the materials described in FIGS. 3C and 7A above. In FIG. 9A, a first SHL 902 is deposited on a first shield 922a, a first FL 906 is deposited on the first SHL 902, and a GL 910 is deposited on the first FL 906 to form a first portion 940a of stack 940.

In FIG. 9B, a first photoresist or photo stencil 934a is deposited over the first stack portion 940a on the GL 910 to define a track-width of the first stack portion 940a. The portions of the GL 910, the first SHL 902, and the first FL 906 uncovered by the first photo stencil 934a are then removed (i.e., the outer ends of the first stack portion 940a) to reveal refill layers 936a, 936b disposed behind the first stack portion 940a. The removal of the out ends of the first stack portion 940a defines the track-width or the horizontal width of the first stack portion 940a. In FIG. 9C, a thin layer of insulation material 932a, 932b, 932e is deposited on a first top surface 902a and the second top surface 902b of the first shield 922a, and around the first FL 906, the first SHL 902, the GL 910, and the first photo stencil 934a. Furthermore, a first hard bias layer 924a and a second hard bias layer 924b are deposited on the insulation materials 932a, 932b and in front of the refill layers 936a, 936b. In FIG. 9D, the insulation layers 932a, 932b disposed in contact with the first SHL 902, the GL 910, and the first photo stencil 934a are removed, such as by milling. The insulation layers 932a, 932b disposed in contact with the first FL 906 and the first shield 922a remain.

In FIG. 9E, the first photo stencil 934a is removed and additional first hard bias layer 924a and second hard bias layer 924b materials are deposited around in in contact with the first SHL 902 and the GL 910. In FIG. 9F, additional GL 910 material is optionally deposited on the previously deposited GL 910 and on the hard bias layers 924a, 924b (collectively referred to as hard bias layers 924). A second SHL 904 is deposited on the GL 910, a second FL 908 is deposited on the second SHL 904, and a second insulation layer 920a is deposited on the second FL 908 to form a second portion 940b of the stack 940. A second photo stencil 934b is deposited over the second stack portion 940b on the second insulation layer 920a to define a track-width of the second stack portion 940b. The track-width of the second stack portion 940b is equal to the track-width of the first stack portion 940a.

In FIG. 9G, the portions of the GL 910, the second SHL 904, and the second FL 908, and the second insulation layer 920a uncovered by the second photo stencil 934b are then removed (i.e., the outer ends of second stack portion 940b). The remaining portion of the second stack portion 940b and the first stack portion 940a collectively form the stack 840. In FIG. 9H, additional insulation material 932f is deposited on the exposed top surface of the first and the second hard bias layers 924a, 924b. The additional insulation material 932f is also deposited surrounding the second stack portion 940b and the second photo stencil 934b. In FIG. 9H, the additional insulation material 932f located on top of the second photo stencil 934b is removed such that a first insulation layer 932c is disposed on one side of the second stack portion 940b adjacent to the first hard bias layer 924a and a second insulation layer 932d is disposed on the opposite side of the second stack portion 940b adjacent to the second hard bias layer 824b.

In FIG. 9I, additional hard bias layer 924 materials are deposited on the previously deposited hard bias layers 924a, 924b, where the top surface of the hard bias layers 924a, 924b are aligned with the top surface of the second insulation layer 920a. An additional hard bias layer 926 is deposited on the first and the second hard bias layers 924a, 924b and around the thin insulation layers 932c, 932d. Furthermore, the additional hard bias layer 926 is deposited on top of and surrounding the second photo stencil 934b. In FIG. 9J, the second photo stencil 934b and a portion of the additional hard bias layer 926 disposed in contact with the second photo stencil 934b (e.g., the additional hard bias layer 926 disposed above the top surface of the second insulation layer 920a) are removed. A top or exposed surface of the additional hard bias layer 926 is aligned with the second insulation layer 920a to form a uniform, flat surface.

In FIG. 9K, additional second insulation layer 920b is deposited on the second insulation layer 920a to form a uniform second insulation layer 920, as well as on the additional hard bias layer 926. The uniform insulation layer 920 is deposited after the stripe height and the track-width of the SOT differential reader 700 are defined. Portions of the uniform insulation layer 920 may be etched in order to expose the electrical contacts of the SOT differential reader 700, similar to as discussed above in other embodiments. In FIG. 9L, a second shield 922b is deposited on the second insulation layer 920.

Figure 10B:
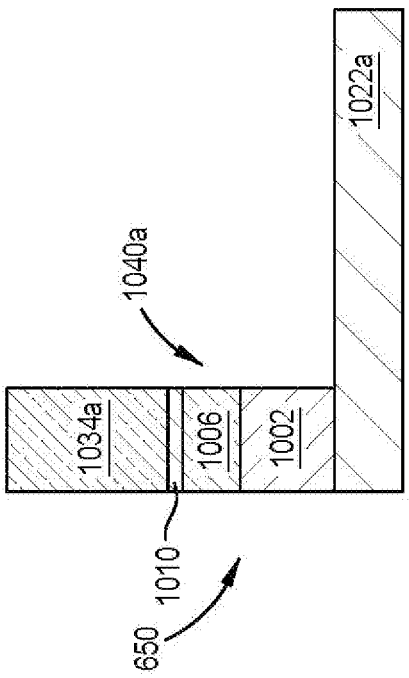
FIG. 10A-10H illustrate a method of forming and defining a stripe height of the SOT differential reader of FIG. 7B, according to one embodiment.
Figure 10A:
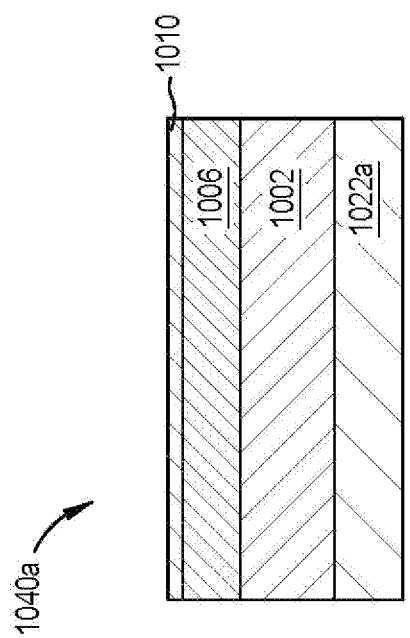

FIGS. 10A-10H illustrate a method of forming and defining a stripe height of the SOT differential reader 700 of FIG. 7B, according to one embodiment. FIGS. 10A-10H illustrate a side cross-sectional view of the SOT differential reader 700 as it is being fabricated. While different reference numerals may be used in FIGS. 10A-10H, the materials of the layers forming the SOT differential reader 700 are the same as the materials described in FIG. 7B above. In FIG. 10A, a first FL 1002 is deposited on a first shield 1022a, a first SHL 1006 is deposited on the first FL 1002, and a GL 1010 is deposited on the first SHL 1006 to form a first portion 1040a of a stack 1040.

In FIG. 10B, a first photoresist or photo stencil 1034a is deposited over the first stack portion 1040a. The portions of the first FL 1002, the first SHL 1006, and the GL 1010 uncovered by the first photo stencil 0134a are then removed (i.e., backside of first stack portion 1040a recessed from the MFS 1050) to define a stripe height of the first stack portion 1040a. In FIG. 10C, a first insulation layer 1020a is deposited where the removed portions of the first FL 1002, the first SHL 1006, and the GL 1010 were located in FIG. 10B (i.e., on the backside of the first stack portion 1040a).

Figure 10D:
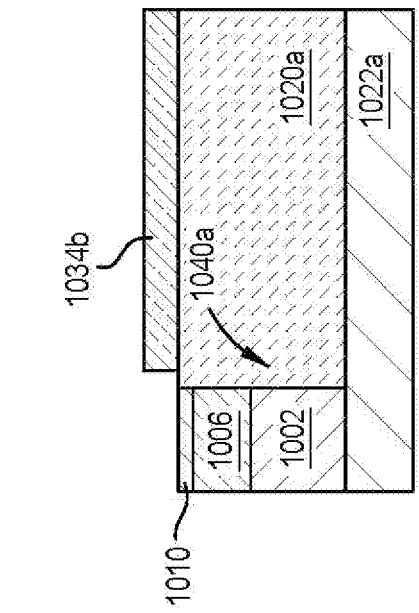
Figure 10C:
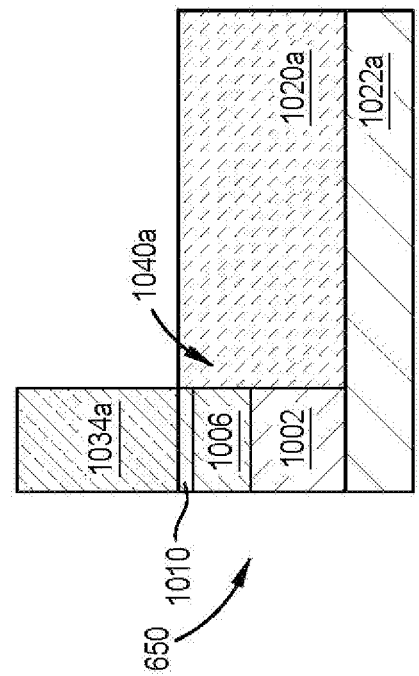
Figure 10E:
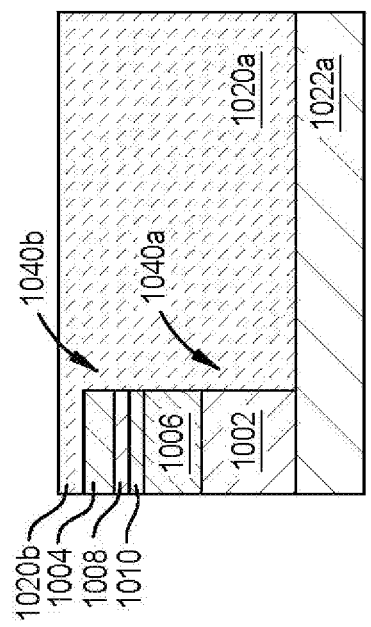

In FIG. 10D, the first photo stencil 1034a is removed, and a second photo stencil 1034b is deposited on the first insulation layer 1020a. The track-width of the first stack portion 1040a is then be defined, such as described above in FIGS. 8A-8L and FIGS. 9A-9L. In FIG. 10E, the second photo stencil 1034b is removed and additional GL 1010 material is deposited on the GL 1010 and the first insulation layer 1020a. A second SHL 1008 is deposited on the GL 1010 and a second FL 1004 is deposited on the second SHL 1008 to form a second portion 1040b of the stack 1040. A second insulation layer 1020b is deposited on the second FL 1004. The first stack portion 1040a and the second stack portion 1040b collectively form the stack 1040. The stack 1040 then forms an electrical lead for the SOT differential reader 700.

Figure 10F:
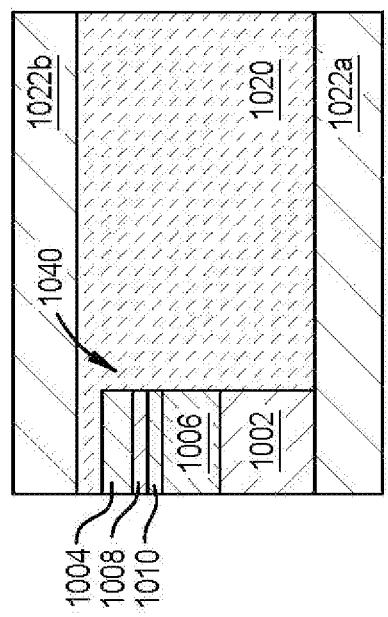

In FIG. 10F, portions of the GL 1010, the second SHL 1008, and the second FL 1004 are removed through a process such as milling to define a stripe height of the second stack portion 1040b. The first stack portion 1040a and the second stack portion 1040b have an equal stripe height. The portions of the GL 1010, the second SHL 1008, and the second FL 1004 removed may form a straight surface or plane, such that the back end of the second stack portion 1040b is aligned with the back end of the first stack portion 1040a. A photo stencil (not shown) may be utilized when removing the portions of the GL 1010, the second SHL 1008, and the second FL 1004. Additional insulation layer 1020 is deposited behind the second stack portion 1040b (e.g., where the removed portions of the second stack portion 1040b were located in FIG. 10E). The first insulation layer 1020a and the second insulation layer 1020 form a uniform layer referred to as insulation layer 1020.

Figure 10G:
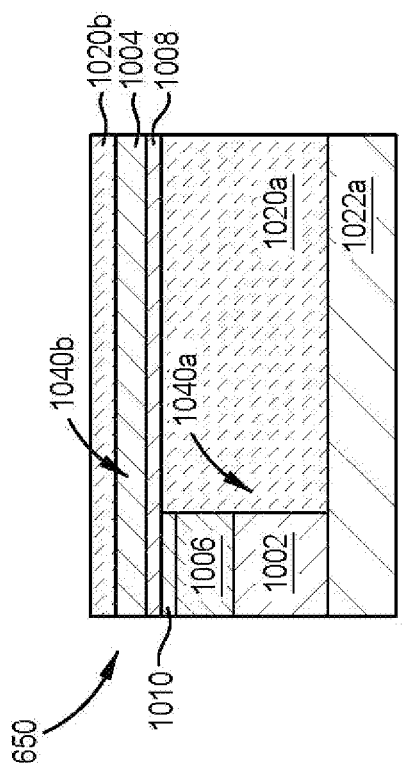
Figure 10H:
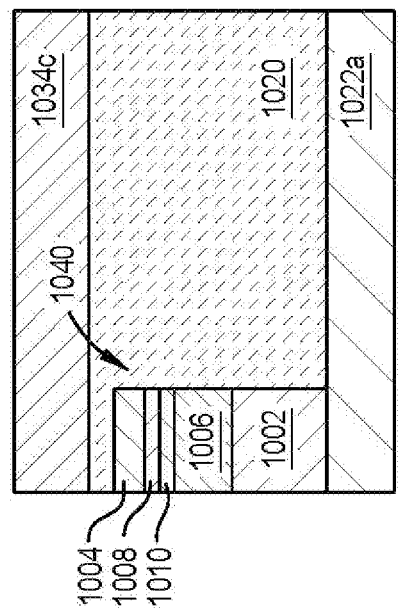

In FIG. 10G, a third photo stencil 1034c is deposited on the insulation layer 1020. Etching may occur once the third photo stencil 1034c is deposited to open one or more electrical lead connections. The uniform insulation layer 1020 is deposited after the stripe height and the track-width of the SOT differential reader 700 are defined. Portions of the uniform insulation layer 1020 may be etched in order to expose the electrical contacts of the SOT differential reader 700, similar to as discussed above in other embodiments. In FIG. 10H, the third photo stencil 1034c is removed, and the second shield 1022b is deposited on the insulation layer 1020.

By utilizing various SOT differential reader designs, where the configuration of the plurality of SHE layers, the plurality of FLs, and the plurality of electrical lead connections may be arranged differently, a better reader resolution may be achieved while maintaining the shield-to-shield spacing. As such, the shield-to-shield spacing of the shields sandwiching the SOT differential reader need not be reduced to enhance the resolution of the reader, as the SOT differential reader may allow wider shield-to-shield spacing without degrading resolution. By being able to increase the shield-to-shield spacing of the SOT differential reader, the amount of flux can be increased, and the stripe height of the layers of the SOT differential reader may be increased to reduce magnetic noise.

In one embodiment, a magnetic recording head comprises a first shield, a second shield, a first bias layer, a second bias layer, and a SOT differential reader disposed between the first shield and the second shield, and between the first bias layer and the second bias layer. The SOT differential reader comprises a first free layer, a second free layer, a first spin hall effect layer, a second spin hall effect layer, the second spin hall effect layer being in contact with the first bias layer and the second bias layer, and one or more insulation layers, wherein a first insulation layer is disposed between the first spin hall effect layer and the first bias layer, and a second insulation layer is disposed between the first spin hall effect layer and the second bias layer.

The magnetic recording head further comprises a gap layer, wherein the first spin hall effect layer is disposed on the first shield, the first free layer is disposed on the first spin hall effect layer, the gap layer is disposed on the first free layer, the second free layer is disposed on the gap layer, and the second spin hall effect layer is disposed on the second free layer. The magnetic recording head is configured to receive current injected into the first spin hall effect layer and output current through the second spin hall effect layer, wherein a first spin hall effect voltage is induced through the second spin hall effect layer, and a second spin hall effect voltage is induced through the first spin hall effect layer.

The magnetic recording head further comprises a gap layer, wherein the first free layer is disposed on the first shield, the first spin hall effect layer is disposed on the first free layer, the gap layer is disposed on the first spin hall effect layer, the second spin hall effect layer is disposed on the gap layer, and the second free layer is disposed on the second spin hall effect layer. A positive terminal of the first spin hall effect layer is electrically connected to a negative terminal of the second spin hall effect layer, and a voltage difference across a negative terminal of the first spin hall effect layer to a positive terminal of the second spin hall effect layer is a signal read out of the SOT differential reader. The first and second bias layers comprise a hard bias material. The first and second bias layers comprise a soft bias material. The first spin hall effect layer has a greater length in a cross-track direction at a media facing surface than the second spin hall effect layer, and wherein the second shield is an electrical lead connection.

In another embodiment, a magnetic recording head comprises a first shield, a second shield, a SOT differential reader disposed at a media facing surface between the first shield and the second shield. The SOT differential reader comprises a first free layer, a second free layer, a gap layer, a first spin hall effect layer, and a second spin hall effect layer, wherein a positive terminal of the first spin hall effect layer is electrically connected to a positive terminal of the second spin hall effect layer, and a signal read out of the SOT differential reader is based on a voltage difference across a negative terminal of the first spin hall effect layer to a negative terminal of the second spin hall effect layer.

The first spin hall effect layer is disposed on the first shield, the first free layer is disposed on the first spin hall effect layer, the gap layer is disposed on the first free layer, the second free layer is disposed on the gap layer, and the second spin hall effect layer is disposed on the second free layer, and wherein the first spin hall effect layer has a greater length in a cross-track direction at a media facing surface than the second spin hall effect layer. The first free layer is disposed on the first shield, the first spin hall effect layer is disposed on the first free layer, the gap layer is disposed on the first spin hall effect layer, the second spin hall effect layer is disposed on the gap layer, and the second free layer is disposed on the second spin hall effect layer, and wherein the SOT differential reader is disposed at a media facing surface and has a stripe height between about 10 nm to about 40 nm.

The magnetic recording head further comprises a first hard bias shield disposed adjacent to a first surface of the SOT differential reader and disposed between the first and second shields, a second hard bias shield disposed adjacent to a second surface of the SOT differential reader and disposed between the first and second shields, a first insulation layer disposed between the first spin hall effect layer and the first hard bias shield, and a second insulation layer disposed between the first spin hall effect layer and the second hard bias shield. The magnetic recording head further comprises a first soft bias shield disposed adjacent to a first surface of the SOT differential reader and disposed between the first and second shields, a second soft bias shield disposed adjacent to a second surface of the SOT differential reader and disposed between the first and second shields, a first insulation layer disposed between the first spin hall effect layer and the first soft bias shield, and a second insulation layer disposed between the first spin hall effect layer and the second soft bias shield. The SOT differential reader comprises one or more electrical lead contacts.

In another embodiment, a method of forming a SOT differential reader comprises depositing a first spin hall effect layer over a first shield, a first free layer on the first spin hall effect layer, a gap layer on the first free layer, a second free layer on the gap layer, a second spin hall effect layer on the second free layer, and a first insulation layer on the second spin hall effect layer to form a stack, removing portions of the first spin hall effect layer, the first free layer, the gap layer, the second free layer, the second spin hall effect layer, and the first insulation layer to define a track-width of the stack, depositing a second insulation layer in contact a first surface, a second surface, and a third surface of the stack, wherein a fourth surface of the stack is a media facing surface, removing a portion of the second insulation layer in contact with the second spin hall effect layer, depositing a first bias layer and a second bias layer in contact with the second spin hall effect layer and the first insulation layer on the first and second surfaces of the stack, and depositing a second shield over the stack.

Removing portions of the first spin hall effect layer, the first free layer, the gap layer, the second free layer, the second spin hall effect layer, and the first insulation layer further defines a stripe height of the stack.

In another embodiment, a method of forming a SOT differential reader comprises depositing a first free layer over a first shield, a first spin hall effect layer on the first free layer, and a gap layer on the first spin hall effect layer to form a first stack, removing portions of the first free layer, the first spin hall effect layer, and the gap layer to define a first track-width of the first stack, depositing a first insulation layer in contact a first surface, a second surface, and a third surface of the first stack, wherein a fourth surface of the first stack is disposed at a media facing surface, removing a portion of the first insulation layer in contact with the first spin hall effect layer and the gap layer, depositing a first bias layer in contact with the first spin hall effect layer, the gap layer, and the first insulation layer, depositing a second spin hall effect layer on the gap layer and a second free layer on the second spin hall effect layer to form a second stack on the first stack, removing portions of the second spin hall effect layer and the second free layer to define a second track-width of the second stack, depositing a second insulation layer in contact a first surface, a second surface, and a third surface of the second stack, wherein a fourth surface of the second stack is disposed at the media facing surface, and depositing a second shield over the second stack.

Removing portions of the first free layer, the first spin hall effect layer, and the gap layer further defines a first stripe height of the first stack. Removing portions of the second spin hall effect layer, the second free layer, and the second insulation layer further defines a second stripe height of the second stack, the first stripe height being equal to the second stripe height.

While the foregoing is directed to embodiments of the present disclosure, other and further embodiments of the disclosure may be devised without departing from the basic scope thereof, and the scope thereof is determined by the claims that follow.

What is claimed is:

1. A sensing element, comprising:
   a first bias layer;
   a second bias layer; and
   a spin orbital torque (SOT) element disposed between the first bias layer and the second bias layer, the SOT element comprising:
      a first free layer;
      a second free layer;
      a first spin hall effect layer;
      a second spin hall effect layer, the second spin hall effect layer being in contact with the first bias layer and the second bias layer; and
      one or more insulation layers, wherein a first insulation layer is disposed between the first spin hall effect layer and the first bias layer, and a second insulation layer is disposed between the first spin hall effect layer and the second bias layer.

2. The sensing element of claim 1, further comprising a gap layer, wherein the first spin hall effect layer is disposed on a first shield, the first free layer is disposed on the first spin hall effect layer, the gap layer is disposed on the first free layer, the second free layer is disposed on the gap layer, and the second spin hall effect layer is disposed on the second free layer.

3. The sensing element of claim 2, wherein the sensing element is configured to receive current injected into the first spin hall effect layer and output current through the second spin hall effect layer, wherein a first spin hall effect voltage is induced through the second spin hall effect layer, and a second spin hall effect voltage is induced through the first spin hall effect layer.

4. The sensing element of claim 1, further comprising a gap layer, wherein the first free layer is disposed on a first shield, the first spin hall effect layer is disposed on the first free layer, the gap layer is disposed on the first spin hall effect layer, the second spin hall effect layer is disposed on the gap layer, and the second free layer is disposed on the second spin hall effect layer.

5. The sensing element of claim 1, wherein a positive terminal of the first spin hall effect layer is electrically connected to a negative terminal of the second spin hall effect layer, and a voltage difference across a negative terminal of the first spin hall effect layer to a positive terminal of the second spin hall effect layer is a signal read out of the SOT element.

6. The sensing element of claim 1, wherein the first and second bias layers comprise a hard bias material.

7. The sensing element of claim 1, wherein the first and second bias layers comprise a soft bias material.

8. The sensing element of claim 1, wherein the first spin hall effect layer has a greater length in a cross-track direction at a media facing surface than the second spin hall effect layer, and wherein a second shield is an electrical lead connection.

9. A magnetic recording device comprising the sensing element of claim 1.

10. The magnetic recording device of claim 9, further comprising:
a first shield; and
a second shield, wherein the SOT element is disposed between the first shield and the second shield.

11. A magnetic recording head, comprising:
a first shield;
a second shield;
a spin orbital torque (SOT) differential reader disposed at a media facing surface between the first shield and the second shield, the SOT differential reader comprising:
a first free layer;
a second free layer;
a gap layer;
a first spin hall effect layer; and
a second spin hall effect layer, wherein a positive terminal of the first spin hall effect layer is electrically connected to a positive terminal of the second spin hall effect layer, and a signal read out of the SOT differential reader is based on a voltage difference across a negative terminal of the first spin hall effect layer to a negative terminal of the second spin hall effect layer.

12. The magnetic recording head of claim 11, wherein the first spin hall effect layer is disposed on the first shield, the first free layer is disposed on the first spin hall effect layer, the gap layer is disposed on the first free layer, the second free layer is disposed on the gap layer, and the second spin hall effect layer is disposed on the second free layer, and wherein the first spin hall effect layer has a greater length in a cross-track direction at the media facing surface than the second spin hall effect layer.

13. The magnetic recording head of claim 11, wherein the first free layer is disposed on the first shield, the first spin hall effect layer is disposed on the first free layer, the gap layer is disposed on the first spin hall effect layer, the second spin hall effect layer is disposed on the gap layer, and the second free layer is disposed on the second spin hall effect layer, and wherein the SOT differential reader is disposed at the media facing surface and has a stripe height between about 10 nm to about 40 nm.

14. The magnetic recording head of claim 11, further comprising:
a first hard bias shield disposed adjacent to a first surface of the SOT differential reader and disposed between the first and second shields;
a second hard bias shield disposed adjacent to a second surface of the SOT differential reader and disposed between the first and second shields;
a first insulation layer disposed between the first spin hall effect layer and the first hard bias shield; and
a second insulation layer disposed between the first spin hall effect layer and the second hard bias shield.

15. The magnetic recording head of claim 13, further comprising:
a first soft bias shield disposed adjacent to a first surface of the SOT differential reader and disposed between the first and second shields;
a second soft bias shield disposed adjacent to a second surface of the SOT differential reader and disposed between the first and second shields;
a first insulation layer disposed between the first spin hall effect layer and the first soft bias shield; and
a second insulation layer disposed between the first spin hall effect layer and the second soft bias shield.

16. The magnetic recording head of claim 12, wherein the SOT differential reader comprises one or more electrical lead contacts.

17. A magnetic recording device comprising the magnetic recording head of claim 11.

18. A method of forming a spin orbital torque (SOT) differential reader, comprising:
depositing a first spin hall effect layer over a first shield, a first free layer on the first spin hall effect layer, a gap layer on the first free layer, a second free layer on the gap layer, a second spin hall effect layer on the second free layer, and a first insulation layer on the second spin hall effect layer to form a stack;
removing portions of the first spin hall effect layer, the first free layer, the gap layer, the second free layer, the second spin hall effect layer, and the first insulation layer to define a track-width of the stack;
depositing a second insulation layer in contact with a first surface, a second surface, and a third surface of the stack, wherein a fourth surface of the stack is a media facing surface;
removing a portion of the second insulation layer in contact with the second spin hall effect layer;
depositing a first bias layer and a second bias layer in contact with the second spin hall effect layer and the first insulation layer on the first and second surfaces of the stack; and
depositing a second shield over the stack.

19. The method of claim 16, wherein removing portions of the first spin hall effect layer, the first free layer, the gap layer, the second free layer, the second spin hall effect layer, and the first insulation layer further defines a stripe height of the stack.

20. A method of forming a spin orbital torque (SOT) differential reader, comprising:
depositing a first free layer over a first shield, a first spin hall effect layer on the first free layer, and a gap layer on the first spin hall effect layer to form a first stack;
removing portions of the first free layer, the first spin hall effect layer, and the gap layer to define a first track-width of the first stack;
depositing a first insulation layer in contact with a first surface, a second surface, and a third surface of the first stack, wherein a fourth surface of the first stack is disposed at a media facing surface;
removing a portion of the first insulation layer in contact with the first spin hall effect layer and the gap layer;
depositing a first bias layer in contact with the first spin hall effect layer, the gap layer, and the first insulation layer;
depositing a second spin hall effect layer on the gap layer and a second free layer on the second spin hall effect layer to form a second stack on the first stack;

removing portions of the second spin hall effect layer and the second free layer to define a second track-width of the second stack;

depositing a second insulation layer in contact with a first surface, a second surface, and a third surface of the second stack, wherein a fourth surface of the second stack is disposed at the media facing surface; and depositing a second shield over the second stack.

21. The method of claim 20, wherein removing portions of the first free layer, the first spin hall effect layer, and the gap layer further defines a first stripe height of the first stack, and wherein removing portions of the second spin hall effect layer, the second free layer, and the second insulation layer further defines a second stripe height of the second stack, the first stripe height being equal to the second stripe height.

* * * * *

UNITED STATES PATENT AND TRADEMARK OFFICE
CERTIFICATE OF CORRECTION

PATENT NO. : 11,100,946 B1
APPLICATION NO. : 16/918841
DATED : August 24, 2021
INVENTOR(S) : Quang Le et al.

Page 1 of 1

It is certified that error appears in the above-identified patent and that said Letters Patent is hereby corrected as shown below:

In the Claims

In Column 24, Line 1, in Claim 15, delete "claim 13," and insert -- claim 11, --, therefor.
In Column 24, Line 13, in Claim 16, delete "claim 12," and insert -- claim 11, --, therefor.
In Column 24, Line 41, in Claim 19, delete "claim 16," and insert -- claim 18, --, therefor.

Signed and Sealed this
First Day of October, 2024

Katherine Kelly Vidal
*Director of the United States Patent and Trademark Office*